(12) United States Patent
Yamada et al.

(10) Patent No.: US 8,094,394 B2
(45) Date of Patent: Jan. 10, 2012

(54) OPTICAL FILTER

(75) Inventors: Tomohiro Yamada, Yokohama (JP);
Masaya Ogino, Kawasaki (JP);
Yasuhisa Inao, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 238 days.

(21) Appl. No.: 12/665,562

(22) PCT Filed: Jul. 14, 2008

(86) PCT No.: PCT/JP2008/063081
§ 371 (c)(1),
(2), (4) Date: Dec. 18, 2009

(87) PCT Pub. No.: WO2009/011439
PCT Pub. Date: Jan. 22, 2009

(65) Prior Publication Data
US 2010/0220377 A1    Sep. 2, 2010

(30) Foreign Application Priority Data

Jul. 13, 2007 (JP) .................................. 2007-184599
May 26, 2008 (JP) .................................. 2008-136686

(51) Int. Cl.
*G02B 5/22* (2006.01)
*G02F 1/03* (2006.01)

(52) U.S. Cl. ..................................... 359/885; 359/241
(58) Field of Classification Search ................... 359/241, 359/244, 245, 885
See application file for complete search history.

(56) References Cited

U.S. PATENT DOCUMENTS

| | | | |
|---|---|---|---|
| 5,229,614 A | 7/1993 | Andersson et al. | 250/370.12 |
| 5,973,316 A | 10/1999 | Ebessen et al. | 250/216 |
| 6,236,033 B1 | 5/2001 | Ebbesen et al. | 250/216 |
| 6,285,020 B1 | 9/2001 | Kim et al. | |
| 2003/0032039 A1 | 2/2003 | Cunningham et al. | 435/6 |
| 2003/0103150 A1 | 6/2003 | Catrysse et al. | 348/272 |
| 2004/0190116 A1 | 9/2004 | Lezec et al. | 359/298 |
| 2008/0297800 A1 | 12/2008 | Yamada et al. | |
| 2009/0310133 A1 | 12/2009 | Ogino et al. | |

(Continued)

FOREIGN PATENT DOCUMENTS

CA    2649772 A1    10/2007

(Continued)

OTHER PUBLICATIONS

Dec. 4, 2008 International Search Report and Written Opinion in International Appln. No. PCT/JP2008/063081.

(Continued)

*Primary Examiner* — Jack Dinh
(74) *Attorney, Agent, or Firm* — Fitzpatrick, Cella, Harper & Scinto

(57) ABSTRACT

An optical filter that transmits light of the visible light region includes a dielectric substrate; a dielectric layer that is formed on a surface of the dielectric substrate; and a first metal structure group in which a plurality of first metal structures are arranged two-dimensionally in an isolated state in the in-plane direction of the dielectric substrate, that is provided between the dielectric substrate and the dielectric layer, comprising: the first metal structures having first and second lengths in first and second directions orthogonal to each other, which lengths are equal to or less than a first wavelength in the visible light region; and a transmittance of the first wavelength being reduced or a reflectance being increased by surface plasmons induced on a surface of the first metal structures by resonance between light incident on the dielectric substrate or the dielectric layer and the first metal structures.

16 Claims, 18 Drawing Sheets

U.S. PATENT DOCUMENTS

| | | |
|---|---|---|
| 2010/0059663 A1 | 3/2010 | Desieres |
| 2010/0097610 A1 | 4/2010 | Yamada et al. |

FOREIGN PATENT DOCUMENTS

| | | |
|---|---|---|
| JP | 2001-133618 A | 5/2001 |
| JP | 2009-534700 A | 9/2009 |
| KR | 10-2006-0130543 A | 12/2006 |
| WO | WO 02/08810 A2 | 1/2002 |
| WO | WO 2006/125196 A2 | 11/2006 |
| WO | WO 2007/118895 A1 | 10/2007 |

OTHER PUBLICATIONS

T.W. Ebessen, et al., "Extraordinary optical transmission through sub-wavelength hole arrays", Nature, vol. 391, Feb. 1998, pp. 667-669.

F.J. García-Vidal, et al., "Transmission of Light through a single rectangular hole", Physical Review Letters, 95(10), 2005, pp. 103901-1-103901-4.

K.L. van der Molen, et al., "Role of shape and localized resonances in extraordinary transmission through periodic arrays of subwavelength holes: Experiment and theory", Physical Review B, 72, 2005, pp. 045421-1-045421-9.

J.A. Matteo, et al., "Spectral analysis of strongly enhanced visible light transmission through single C-shaped nanoapertures", Applied Physics Letters, vol. 85, No. 4, Jul. 26, 2004, pp. 648-650.

Jörg P. Kottmann, et al., "Spectral response of plasmon resonant nanoparticles with a non-regular shape", Optics Express, vol. 6, No. 11, May 22, 2000, pp. 213-219.

William L. Barnes, et al., "Surface plasmon subwavelength optics", Nature, vol. 424, Aug. 14, 2003, pp. 824-830.

Kerwyn Casey Huang, et al., "Negative effective permeability in polaritonic photonic crystals", Applied Physics Letters, vol. 85, No. 4, Jul. 26, 2004, pp. 543-545.

Jan. 28, 2010 International Preliminary Report on Patentability in International Patent Appln. No. PCT/JP2008/063081.

Jul. 20, 2010 Japanese Official Action in Japanese Patent Appln. No. 2008-181500.

OPTICAL FILTER

TECHNICAL FIELD

The present invention relates to an optical filter that utilizes localized surface plasmon.

BACKGROUND ART

Recently, hole-type optical filters in which apertures are periodically arranged in arrays on a metallic thin film and which perform wavelength selection utilizing surface plasmons have been proposed in Patent Document 1 and Non-Patent Document 1.

Conventionally, although also depending on the film thickness, the transmittance of a metallic thin film including an aperture diameter of a size that is less than or equal to a light wavelength is considered to be less than approximately 1%.

However, as described in Patent Document 1, when apertures of a predetermined size are arrayed on a metallic thin film at a period that is consistent with the wavelength of plasmons, the transmittance of light of a wavelength that induces surface plasmons is significantly enhanced.

Further, Non-Patent Document 1 teaches that transmission spectra of RGB can be obtained using this kind of hole-type optical filter that utilizes surface plasmons. More specifically, Non-Patent Document 1 discloses that transmission spectra having wavelengths of 436 nm (blue), 538 nm (green), and 627 nm (red) were obtained using a metallic thin film having subwavelength aperture arrays.

Patent Document 2 discloses a wavelength filter which utilizes a surface plasmon.
(Patent Document 1) U.S. Pat. No. 5,973,316
(Patent Document 2) WO2002/008810
(Non-Patent Document 1) Nature Vol. 424, 14 Aug., 2003 (FIG. 4)

DISCLOSURE OF THE INVENTION

In the above Patent Document 1 and Non-Patent Document 1, by using a metallic thin film having a relatively large surface area in which holes are periodically arranged, a filter is realized that has a transmission spectrum depending on the wavelength of surface plasmons induced on the metal surface.

However, in this kind of hole-type metallic thin film filter, because a large proportion of space is occupied metal, there is a large amount of light absorption. Therefore, in the metallic thin film filter disclosed in the above described Patent Document 1, the transmittance is about 5 to 6% even at a peak at which the transmittance is greatest.

When it is desired to utilize a transmission spectrum of this kind of filter that does not offer a very high transmittance, it is necessary to increase the intensity of incident light in order to ensure the intensity of the transmission spectrum. Consequently, there is the possibility that the energy efficiency of a device that uses a hole-type filter will be low.

In particular, although the absorption of light by metal is not very high in a microwave region, the light absorption of metal is high in a visible light region. Further, when a hole-type metallic thin film filter is used as a filter for a visible light region, the scope of application to actual devices is narrowed.

Therefore, it is desirable to provide a high-transmittance optical filter in which light absorption is less than a hole-type metallic thin film filter in a waveband region containing a visible light region.

The filters described in the above Patent Documents 1 and 2 uses peripheral structures which have apertures or protrusions formed in a metal film having a relatively large surface area with pitches corresponding to wavelengths of the surface plasmons to control the optical properties. That is, the interference between the surface plasmons propagating along the peripheral structures selects the surface plasmon waves with their respective wavelengths corresponding to the pitches, and the selected waves then gather the intensities each other to increase the intensity of a transmitted light and the intensity of a reflected light.

Therefore, in the filters described in the above documents, the pitches of the peripheral structures become a dominant factor defining the optical characteristics of the filters. And when a wavelength is selected to obtain a certain optical characteristics, the pitches of the peripheral structures depend on the wavelength. That is, when a certain wavelength is selected, a density of the apertures or the protrusions in the metal film might be restricted.

It is thus difficult to increase the transmittance or reflectance of the filters.

And also, since the filters described in the above documents need peripheral alignment of the apertures or the protrusions, the size and the surface area of the filter should be set to times the pitch. The filters of Patent Documents 1 and 2 thus have lower degree of freedom regarding the selection of size.

And it is desirable to provide an optical filter having a greater degree of freedom regarding the selection of size in comparison with filters which utilize the surface plasmon corresponding to the peripheral structure in a metal film having a relatively large surface area.

The present invention is directed to an optical filter that transmits light of a first wavelength, including:
a dielectric substrate;
a first metal structure group in which a plurality of first metal structures are arranged two-dimensionally in an isolated state in the in-plane direction of the dielectric substrate, that is provided on a surface of the dielectric substrate; and
a dielectric layer with which the first metal structure group is covered, comprising:
the first metal structures having a first length in a first direction and a second length in a second direction orthogonal to the first direction; the first length and the second length being less than or equal to the first wavelength; and
a transmittance of the first wavelength being made minimal or a reflectance of the first wavelength being made maximal by localized surface plasmons induced on a surface of the first metal structures by resonance between light incident on the dielectric substrate or the dielectric layer and the first metal structures.

In the optical filter, a period at which the first metal structures in the first metal structure group are arranged can be less than or equal to the first wavelength.

The first length and the second length can be the same.

The first metal structures can be in square shape.

In the optical filter, a thickness of the first metal structures can be less than or equal to the first wavelength.

The first metal structures can consist of aluminium, or an alloy or a mixture including aluminium.

In the optical filter, a dielectric constant of the dielectric substrate and a dielectric constant of the dielectric layer can be the same.

The dielectric substrate and the dielectric layer can be comprised of any one selected from the group consisting of silicon dioxide, titanium dioxide, and silicon nitride.

The optical filter can comprise a distance from the surface of the dielectric layer to the surface of the first metal structure is less than or equal to a value d expressed by the following formula:

$$d = \frac{\lambda_{res}^2}{2n\Delta\lambda_{FW}}$$

in which $\lambda_{res}$ denotes a plasmon resonance wavelength of the first metal structures, n denotes a refractive index of the dielectric layer, and $\Delta\lambda_{FW}$ denotes a full width at half maximum of a resonance spectrum of the first metal structure.

In the optical filter, a distance from the surface of the dielectric layer to the surface of the first metal structures can be less than or equal to a value d expressed by the following formula:

$$d = \frac{\lambda_{res} - \Delta\lambda_{HW}}{2n}$$

in which $\lambda_{res}$ denotes a plasmon resonance wavelength of the first metal structures, n denotes a refractive index of the dielectric layer, and $\Delta\lambda_{HW}$ denotes a half width at half maximum of a resonance spectrum of the first metal structure.

The optical filter can comprises that the first length and the second length are within a range of 110 nm or more and 160 nm or less, a thickness of the first metal structures is within a range of 10 nm or more and 200 nm or less, a period at which the first metal structures are arranged is within a range of 340 nm or more and 450 nm or less, and the first wavelength is within a range of 550 nm or more and less than 650 nm.

The optical filter can comprise that the first length and the second length are within a range of 90 nm or more and less than 130 nm, a thickness of the first metal structures is within a range of 10 nm or more and 200 nm or less, a period at which the first metal structures are arranged is within a range of 260 nm or more and 340 nm or less, and the first wavelength is within a range of 450 nm or more and less than 550 nm.

The optical filter can comprise that the first length and the second length are within a range of 60 nm or more and less than 100 nm, a thickness of the first metal structures is within a range of 10 nm or more and 200 nm or less, a period at which the first metal structures are arranged is within a range of 180 nm or more and 280 nm or less, and the first wavelength is within a range of 350 nm or more and less than 450 nm.

The optical filter can include two or more of the first metal structure groups in an in-plane direction of the dielectric substrate; and periods at which the first metal structures comprising the two or more first metal structure groups are arranged are different to each other, and the two or more first metal structure groups are arranged in different regions of the dielectric substrate surface.

The optical filter can include, in addition to the first metal structure group, a second metal structure group in which a plurality of second metal structures are arranged two-dimensionally in an isolated state in an in-plane direction of the dielectric substrate, wherein the second metal structures have a third length in the first direction and a fourth length in the second direction, and the third length and the fourth length are less than or equal to a second wavelength different from the first wavelength;

the third length is different to the first length or the fourth length is different to the second length;

the first metal structure group and the second metal structure group are arranged in different regions of the dielectric substrate surface; and a transmittance of the second wavelength is made minimal or a reflectance of the second wavelength is made maximal by localized surface plasmons induced on a surface of the second metal structures by resonance between light incident on the dielectric substrate or the dielectric layer and the second metal structures.

The optical filter can include two or more of the first metal structure groups in an in-plane direction of the dielectric substrate, comprising the two or more first metal structure groups are arranged in overlapping regions.

The optical filter can include two or more of the first metal structure groups in an in-plane direction of the dielectric substrate, comprising:

periods at which the first metal structures comprising the two or more first metal structure groups are arranged are different to each other; and the two or more first metal structure groups are arranged in overlapping regions.

The optical filter can include, in addition to the first metal structure group, a second metal structure group in which a plurality of second metal structures are arranged two-dimensionally in an isolated state in an in-plane direction of the dielectric substrate, comprising:

the second metal structures have a third length in the first direction and a fourth length in the second direction, and the third length and the fourth length are less than or equal to a second wavelength different from the first wavelength;

the third length is different to the first length or the fourth length is different to the second length;

the first metal structure group and the second metal structure group are arranged in overlapping regions; and a transmittance of the second wavelength is made minimal or a reflectance of the second wavelength is made maximal by localized surface plasmons induced on a surface of the second metal structures by resonance between light incident on the dielectric substrate or the dielectric layer and the second metal structures.

The present invention is directed to an optical filter that transmits or reflects light, including:

a dielectric substrate;

a first metal structure group and a second metal structure group comprising a plurality of metal structures arranged in an isolated state in an in-plane direction of the dielectric substrate, that are provided on a surface of the dielectric substrate; and a dielectric layer with which the first and second metal structure groups are covered, wherein the first metal structure group and the second metal structure group are arranged in different regions of the dielectric substrate surface;

first metal structures comprising the first metal structure group are arranged in a first direction, and have a first length in the first direction and a second length in a second direction that is orthogonal to the first direction, and the first length and the second length are lengths that are less than or equal to the first wavelength;

second metal structures comprising the second metal structure group are arranged in the first direction, and have a third length in the first direction and a fourth length in the second direction, with the third length and the fourth length being lengths that are less than or equal to a second wavelength different from the first wavelength, and with the first length and the third length being different or the second length and the fourth length being different;

a transmittance of a first wavelength is made minimal or a reflectance of the first wavelength is made maximal by localized surface plasmons induced on a surface of the first metal structures; and a transmittance of a second wavelength is made minimal or a reflectance of the second wavelength is made maximal by localized surface plasmons induced on a surface of the second metal structures.

In the optical filter, a period at which the first metal structures are arranged and a period at which the second metal structures are arranged can be the same.

The present invention is directed to a laminated optical filter, in which another dielectric layer is formed on a surface of the dielectric layer that comprises an optical filter according to claim 1, including:

a third metal structure group in which a plurality of third metal structures are arranged two-dimensionally in an isolated state in the in-plane direction of the dielectric layer surface, that is provided between the dielectric layer surface and the other dielectric layer, wherein the third metal structures comprised of the third metal structure group have a fifth length in the first direction and a sixth length in the second direction, and the fifth length and the sixth length are lengths that are less than or equal to a third wavelength different from a first wavelength;

the first length and the fifth length are different or the second length and the sixth length are different, or a period at which the third metal structures are arranged is different to a period at which the first metal structures are arranged;

a transmittance of a first wavelength is made minimal or a reflectance of the first wavelength is made maximal by localized surface plasmons induced on a surface of first metal structures; and a transmittance of the third wavelength is made minimal or a reflectance of the third wavelength is made maximal by localized surface plasmons induced on a surface of the third metal structures.

The present invention is directed to a light-detecting device comprising the optical filter.

The present invention is directed to an image capturing device comprising the light-detecting device.

The present invention is directed to a camera comprising the image capturing device.

The present invention is directed to an optical filter that transmits or reflects light of the visible light region, including:

a dielectric substrate;

a dielectric layer formed on a surface of the dielectric substrate; and a first metal structure group provided between the dielectric substrate and the dielectric layer in which a plurality of first metal structures are arranged periodically and two-dimensionally in an isolated state in the in-plane direction of the dielectric substrate, comprising:

the first metal structures having a first length in a first direction and a second length in a second direction orthogonal to the first direction; the first length and the second length being less than or equal to the light of the visible light region; and a transmittance of the first wavelength in the visible light region being made minimal or a reflectance of the first wavelength in the visible light region being made maximal by localized surface plasmons induced on a surface of the first metal structures by resonance between light incident on the dielectric substrate or the dielectric layer and the first metal structures.

According to the present invention it is possible to provide a high-transmittance optical filter in which light absorption is less than a hole-type metallic thin film filter in a waveband region containing a visible light region.

Further, according to the present invention it is possible to provide an optical filter having a greater degree of freedom regarding the selection of size in comparison with filters which utilize the surface plasmon corresponding to the peripheral structure in a metal film having a relatively large surface area.

Further features of the present invention will become apparent from the following description of exemplary embodiments with reference to the attached drawings.

BEST MODES FOR CARRYING OUT THE INVENTION

The inventors of the present invention focused on the fact that the transmittance of light is low in a hole-type metallic thin film, and studied a dot-type optical filter in which a plurality of metal structures are arranged on a dielectric substrate.

A metal particle, in particular a particle that is approximately the size of a light wavelength or a size less than that, can generate localized surface plasmon resonance (LSPR).

In this case, the term "plasmon" refers to collective oscillation of free electrons on a metal surface that is excited by an external electric field such as light. Because electrons are electrically charged, polarization occurs due to the density distribution of free electrons that is caused by oscillation of electrons. A phenomenon in which that polarization and an electromagnetic field are combined is referred to as "plasmon resonance".

In particular, a resonance phenomenon between light and plasma oscillations of free electrons produced on a metal microstructure or a metal particle surface is referred to as localized surface plasmon resonance (LSPR).

More specifically, collective oscillation of free electrons on a metal particle surface is excited by an external electric field such as light, density distribution of electrons and polarization accompanying that density distribution is produced by the oscillation, and an electromagnetic field arises that localizes in the vicinity of the particle.

Comparing filters of the same surface area, it is found that the metal portion of a dot-type optical filter in which a plurality of metal structures are arranged (for example periodically arranged) on a dielectric substrate can be decreased in comparison to a hole-type optical filter. Therefore, since a dot-type optical filter offers a configuration that facilitates a large aperture portion and in which absorption of light by metal can be suppressed, the overall transmittance can be increased in comparison to a hole-type optical filter.

Figure 14:
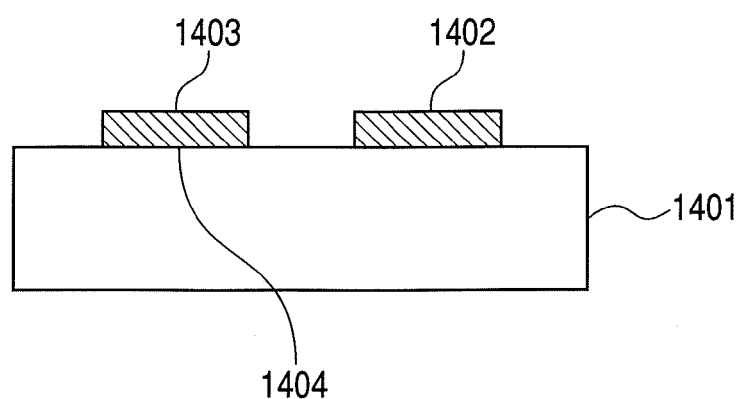
FIG. 14 is a schematic diagram that is used when describing an embodiment of the present invention.

FIG. 14 is a schematic diagram of a dot-type optical filter in which pluralities of metals 1402 are disposed (for example, at a certain period) on a dielectric substrate 1401. By adopting this configuration, it is possible to obtain a transmission spectrum having a minimum value of transmittance at a specific wavelength.

It is due to light of a specific wavelength is absorbed and dispersed by the LSPR that occurs, a transmittance minimum value arises in the transmission spectrum.

As long as a metal structure has a material thickness of several nm or more, the occurrence of LSPR can be caused using even a minute metal structure.

The inventors of the present invention studied the optical filters utilizing localized surface plasmon resonance.

However, when the inventors of the present invention progressed the study, they found some undesirable phenomena for an optical filter in the case of the metals 1402 are merely arranged on top of the dielectric substrate 1401.

More specifically, when the metals 1402 are merely arranged on top of the dielectric substrate 1401, there is a difference between the frequency of plasmon resonance at the boundary (metal upper surface 1403) between air and the metals and the frequency of plasmon resonance at the boundary (metal lower surface 1404) between the metals 1402 and the dielectric substrate 1401. It was found that, as a result, enlargement of the optical spectrum width or peak splitting occurs, and characteristics that are not preferable for an optical filter appear.

Further, when using this optical filter as a reflective filter, the reflection characteristics differ according to whether incident light is incident from the dielectric substrate side or from the metal side. Therefore, to manifest the desired optical characteristics, the optical filter must allow light to be incident from only one given direction, and there is the possibility that the degree of design freedom of an optical system that uses this kind of optical filter will be reduced.

There is also the problem that a shift in a peak wavelength occurs if dirt attaches to the surface of the metals.

Therefore, the inventors of the present invention studied structures in which metals are embedded in a dielectric material. As a result, the inventors of the present invention succeeded in suppressing splitting of spectral peaks and peak width enlargement that are caused by a difference in plasmon resonance frequencies at a boundary between air and metal.

Further, the inventors of the present invention found that it is also possible to prevent oxidation of metal and to suppress changes (shifts in peak wavelengths) in optical characteristics caused by dirt adhering to the metal surfaces.

In this connection, when attempting to use a device such as a coloring filter or a dielectric multilayer filter that is a common optical filter, a film thickness that is greater than or equal to the wavelength of light is necessary. More specifically, a film thickness of approximately 1 μm or more is required.

In contrast, according to the optical filter of the present invention, it is possible to construct a filter in which the film thickness includes a metal thickness of approximately 100 nm or less. Since the overall film thickness can be kept to approximately 200 nm even if a protective layer of approximately 100 nm is laminated on top of the metal structures, it is possible to provide a filter that has a thin film thickness in comparison to a conventional filter.

Consequently, if the optical filter according to the present invention is used in a light receiving element such as a CCD sensor or a CMOS sensor, the light receiving element can be made smaller. Further, if the optical filter according to the present invention is used in a light receiving element, it is also possible to alleviate insufficiencies in the amount of received light that are caused by a decrease in the observation angle of each pixel that accompanies the provision of a large number of pixels in the light receiving element.

First Embodiment

Single-Layer Optical Filter and Laminated Optical Filter

Hereunder, an embodiment of the present invention is described using the drawings. First, the items denoted by reference numerals in the FIGS. are listed: 110: dielectric substrate, 120: metal structure, 121: first metal structure, 122: first metal structure, 130: dielectric layer, 140: first direction, 141: first length, 145: period, 150: second direction, 151: second length, 155: period, 160: thickness of metal structure, 170: thickness after subtracting metal structure thickness from dielectric layer thickness, 201: transmission spectrum R, 202: transmission spectrum G, 203: transmission spectrum B, 301: region, 302: region, 303: region, 401: first metal structure, 402: first metal structure group, 403: first metal structure, 404: first metal structure group, 405: period, 406: period, 407: first metal structure, 408: second metal structure, 501: first metal structure group, 502: first direction, 503: second direction, 504: first length, 505: second length, 506:

second metal structure group, 507: third length, 508: fourth length, 701: dielectric substrate, 702: first metal structure group, 703: first dielectric layer, 704: third metal structure group, 705: second dielectric layer (other dielectric layer), 801: dielectric substrate, 802: metallic thin film layer, 803: resist, 804: metallic thin film structure, 805: dielectric layer, 901: transmission spectrum R, 902: transmission spectrum G, 903: transmission spectrum B, 904: reflection spectrum R, 905: reflection spectrum G, 906: reflection spectrum B, 1001: dielectric substrate, 1002: metallic thin film layer, 1003: resist for electron beam lithography, 1004: pattern portion A, 1005: pattern portion B, 1006: pattern portion C, 1007: metallic thin film structure, 1008: dielectric layer, 1101: transmission spectrum R, 1102: transmission spectrum G, 1103: transmission spectrum B, 1201: dielectric substrate, 1202: first metallic thin film layer, 1203: resist, 1204: first metallic thin film structure, 1205: first dielectric layer, 1206: second metallic thin film layer, 1207: second metallic thin film layer, 1208: second dielectric layer, 1301: transmission spectrum, 1302: transmission spectrum, 1303: laminated filter transmission spectrum, 1401: dielectric substrate, 1402: metal, 1403: metal upper surface, 1404: metal lower surface, 1501: metal structure, 1502: metal structure, 1503: transmission spectrum, 1504: transmission spectrum, 1505: transmission spectrum, 1506: period, 1601: first metal structure, 1602: first metal structure group, 1603: second metal structure, 1604: second metal structure group, 1801: first length, 1802: second length, 2201: transmission spectrum, 2202: transmission spectrum.

Figure 1A:
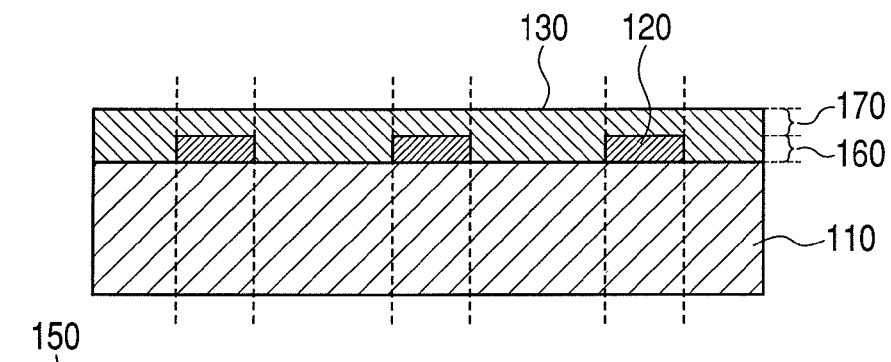
FIGS. 1A and 1B are schematic diagrams that illustrate a first embodiment of the present invention.
Figure 1B:
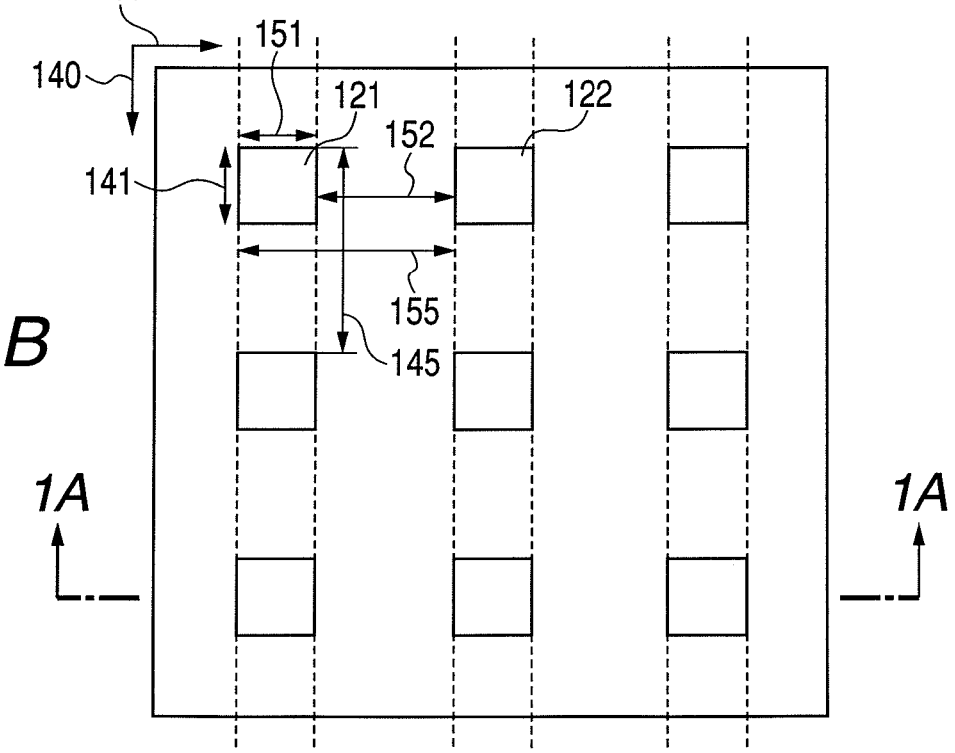

FIG. 1B is a top view of an optical filter that is a first embodiment of the present invention. FIG. 1A is a sectional view along a line 1A-1A shown in FIG. 1B.

A dielectric layer 130 is provided on the surface of a dielectric substrate 110. A plurality of metal structures 120 are arranged between the dielectric substrate 110 and the dielectric layer 130.

The metal structures 120 are two-dimensionally and periodically arranged in an isolated state in the in-plane direction of the dielectric substrate 110 to constitute a metal structure group. In this connection, for description purposes, two first metal structures that constitute a first metal structure group are denoted by reference numerals 121 and 122.

The optical filter of the present invention utilizes localized surface plasmon resonance induced in a metal structure itself. In the invention, the periodical arrangement of the plurality of the metal structures 120 is preferable as described blow.

When the localized surface plasmon is induced in a metal structure, an electrical field penetrates from the metal structure. So when pluralities of the metal structures are arranged in the range of penetration length of the electrical field, resonance condition of each metal structure is effected each other. To decrease the effect it is preferable in the invention that a metal structure is arranged at a position where electromagnetic relations between a metal structure and metal structures adjacent thereto are almost equivalent to each other, which means a periodical arrangement of the metal structures.

The periodical arrangement of metal structures restrains a mismatching of the plasmon resonance condition between the metal structures, and, a localized surface plasmon having the same wavelength and the same phase can be induced in each structure. Thus a dip in a resonance peak in a transmission spectrum can be deeper and a width of the peak can be narrower. And also as a giving of diffracted light can be restrained, an effect on a shape of transmission spectrum can be reduced.

In the case where a plurality of metal structures is arranged too close to each other, the resonance conditions of the metal structures are strongly affected by each other so that there is a fear that a desirable resonance wavelength or spectrum width might not be obtained and a transmittance might be decreased. Considering that an electrical field from the metal structure penetrates almost up to the same length as the metal structure its self's size when localized plasmon resonance is obtained, it is preferable that a plurality of the metal structures are arranged at a distance of approximately equal to the size of the metal structure.

Also it is preferable that the metal structures are arranged apart from each other to such a degree that the above-mentioned penetration length is not overlapped, namely arranged apart at a distance approximately twice or more as long as the size of the metal structure.

On the other hand, a distance between each metal structure becomes larger to such a degree of almost three times as long as the size of the metal structure, a dip in a transmission spectrum becomes shallow.

Accordingly, concerning a distance between each metal structure arranged periodically it is preferable that the distance is equal to the size of the metal structure its self or more, and between the range up to three times the metal structure's size, further approximately twice as long as that.

In FIG. 1B, the first metal structure 121 includes a first length 141 in a first direction 140, and includes a second length 151 in a second direction 150 that is orthogonal to the first direction 140. In this case, the first length 141 and the second length 151 are set to, for instance, a length that is less than or equal to an optical wavelength in a visible light region. Even when the wavelength of plasmons induced at the metal structure is in the mode of the lowest order (dipolar mode), the half-wavelength of plasmons is substantially the same as the size of a metal structure. Thus, because the size of a structure on which plasmons can be excited with e.g. visible light is shorter than an excitation wavelength of visible light, these lengths are made less than or equal to an optical wavelength in a visible light region.

Further, it is preferable to make the first length 141 and the second length 151 less than or equal to the plasmon resonance wavelength (the first wavelength).

In this case, as one example, the first metal structure 121 is assumed to be a square shape in which the first length and the second length are the same and one side is 120 nm. Although a square shape is preferable in the respect of design ease with regard to optical characteristics, metal of a circular shape, an elliptical shape, or another polygonal shape can also be used as a metal structure. For example, a metal with a circular shape is also suitable since it is possible to suppress polarization dependency and manufacturing precision is also easily maintained.

Figure 18C:
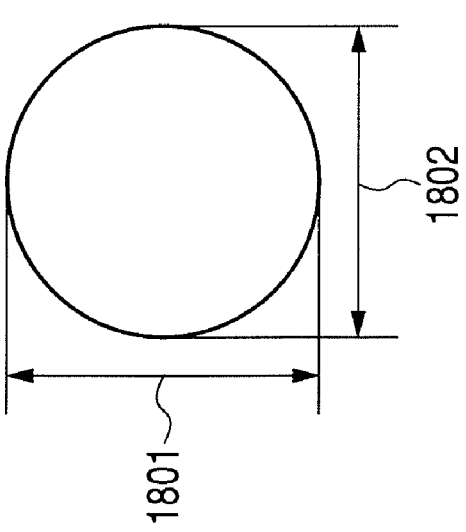
FIGS. 18A, 18B and 18C are schematic diagrams in which the lengths of metal structures are defined.
Figure 18B:
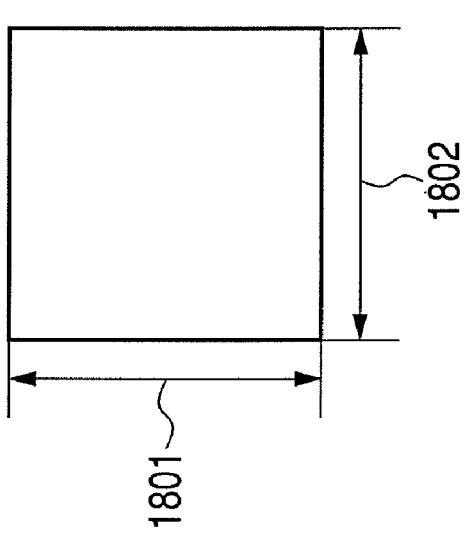
Figure 18A:
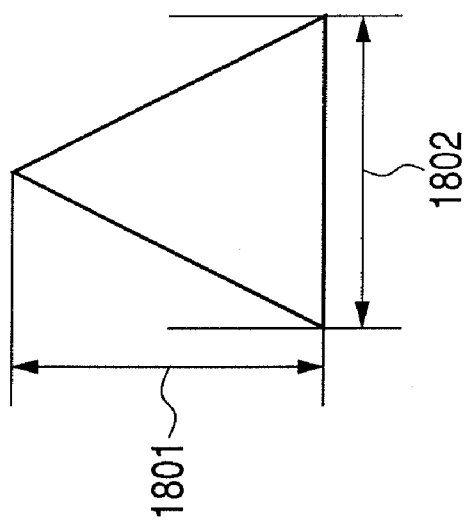

When a metal structure that is not a square shape is used, as shown in FIGS. 18A to 18C, the first length and the second length are handled as the lengths denoted by reference numerals 1801 and 1802, respectively.

The metal structure is not limited in shape to the above but may have various shapes. On the other hand, the first or second length may be regarded as a maximum width of the metal structure.

According to the present embodiment, the transmittance of a predetermined wavelength (the first wavelength) in a visible light region is made to amount to a minimal value by localized surface plasmons that are induced on the surface of a metal structure by resonance between light that is incident on the dielectric substrate or dielectric layer and the metal structure.

For the first metal structure group shown in FIGS. 1A and 1B, a form can also be adopted in which a period 145 and a period 155 at which the metal structures 120 are arranged may be equal to or less than an optical wavelength in a visible light region and preferably equal to or less than a plasmon resonance wavelength (the first wavelength). This is because, when the periods at which metal structures are arranged are greater than the optical wavelength region of interest, there is a possibility that diffracted light of a high order will occur and the intensity of zero-order diffracted light will decrease.

Further, a form can also be adopted in which the period 145 and the period 155 at which the metal structures 120 are arranged are less than a plasmon resonance wavelength (first wavelength) of the first metal structure group. This is because, when the periods at which the metal structures are arranged are near to the plasmon resonance wavelength, light of a wavelength that causes Wood's anomaly combines with the plasmon resonance such that a peak shape caused by the plasmon resonance sharpens and the depth of a transmittance minimum value at the resonance wavelength becomes shallow. In this case, the term "Wood's anomaly" refers to a phenomenon whereby incident light is diffracted by a periodic structure, and the diffracted light is propagated extremely near to the metal periodic structure surface in a manner that is parallel with the surface.

In this case, as one example, with the object of generating plasmon resonance in a red wavelength band, the periods 145 and 155 are assumed to be 400 nm.

A form can also be adopted in which a space 152 between the first metal structures 121 and 122 is greater than the first length 141 and the second length 151. By setting this space, it is possible to suppress the enlargement of spectral peak widths or shifts in peak wavelengths that are caused by near-field interaction between metal body structures.

Further, a form can also be adopted in which a thickness 160 of the metal structures 120 may be less than or equal to an optical wavelength in a visible light region and preferably equal to or less than a plasmon resonance wavelength (the first wavelength). The reason is that if the thickness of a metal structure is set to be too thick in a micro-fabrication process when producing the filter, a manufacturing error will be large. In this case, as one example, the thickness 160 is assumed to be 30 nm.

Aluminum, gold, silver, platinum, or the like can be used as the material of the metal structures 120. Among these, the plasma frequency of aluminum is high compared to silver, and with aluminum the design of a filter with optical characteristics that cover the entire visible range is physically easy (Ag: ~3.8 eV (~325 nm), Al: ~15 eV (~83 nm)).

Further, in comparison to silver and the like, aluminum is less likely to undergo oxidation and is chemically stable, and can thus stably express predetermined optical characteristics for a long period.

Furthermore, since an imaginary part of the dielectric constant of aluminum is larger than in the case of silver, aluminum can achieve an adequate light blocking effect in comparison to silver even if the film thickness is thin, and micromachining is also easy.

In addition, since aluminum is extremely inactive chemically, similarly to platinum, aluminum also has no drawbacks such as difficulty in micromachining by dry etching.

In this connection, the metal structures 120 may also be an alloy or a mixture including aluminum, gold, silver, and platinum.

The material of the dielectric substrate 110 can be suitably selected from metallic oxides such as titanium dioxide or quartz (silicon dioxide) that are materials that transmit light of e.g. a visible light region, or materials that have a high transmittance such as silicon nitride. Further, a high polymer material such as polycarbonate or polyethylene terephthalate can also be used as the material of the dielectric substrate 110.

Similarly to the dielectric substrate 110, the material of the dielectric layer 130 can be suitably selected from quartz (silicon dioxide), titanium dioxide, silicon nitride and the like. Further, a high polymer material such as polycarbonate or polyethylene terephthalate can also be used as the material of the dielectric layer 130.

A difference between the dielectric constant of the dielectric substrate 110 and that of the dielectric layer 130 can be 5% or less. The reason is that, when there is a large difference between the dielectric constant of the dielectric substrate 110 and the dielectric constant of the dielectric layer 130, there is a large difference between the excitation wavelength of plasmons occurring at the boundary of the metal structures 120 and the dielectric substrate 110 and the excitation wavelength of plasmons occurring at the boundary of the metal structures 120 and the dielectric layer 130. As a result, there is a risk that a peak of a resonance wavelength other than a desired peak will occur or that peak width enlargement will occur.

Therefore, it is most preferable that the dielectric constant of the dielectric substrate and the dielectric constant of the dielectric layer are identical.

A thickness 170 that is obtained by subtracting the thickness 160 of the metal structures 120 from the thickness of the dielectric layer need not be thick. The reason is that, if the thickness of the dielectric layer is too thick, because the dielectric layer 130 forms one kind of Fabry-Perot resonator, there is a concern that a large number of minute dips will appear in the transmission spectrum.

Therefore, it is suitable that, for example, the resonator modes of a Fabry-Perot resonator do not exist within a wavelength range of full width at half maximum of the plasmon resonance of the metal structures 120.

To achieve this, it is necessary that at least a range (FSR) of the resonator modes is wider than the full width at half maximum of the plasmon resonance. This condition is expressed below:

$$d = \frac{\lambda_{res}^2}{2n\Delta\lambda_{FW}}$$

where $\lambda_{res}$ denotes a plasmon resonance wavelength of the metal structures, n denotes a refractive index of the dielectric layer, and $\Delta\lambda_{FW}$ denotes a full width at half maximum of the resonance spectrum of the metal structures.

In this case, the symbol d in the equation corresponds to the thickness of the dielectric layer. Accordingly, since, for example, the full width at half maximum of the plasmon resonance is typically 100 nm, if the plasmon resonance wavelength is assumed to be 650 nm and the refractive index of the dielectric layer is assumed to be 1.46, d is calculated to be 1447 nm. For this reason, when the wavelength region of interest is 650 nm±50 nm, to ensure that the FSR is 100 nm or more in this wavelength region it is necessary that the thickness of the dielectric layer is equal to or less than this value d.

A configuration is also preferable embodiment to ensure that the resonator modes of the Fabry-Perot resonator only appear in a wavelength region that is shorter than the wavelength region of interest.

The resonator modes of the Fabry-Perot resonator occur at a wavelength that is equal to two times the resonator length. When the wavelength region of interest is assumed to be a wavelength region that is inside the resonance width of the metal structures, the shortest wavelength of the wavelength region of interest is a value obtained by subtracting the half width at half maximum of the resonance from the resonance wavelength. Therefore, in order for the resonator modes of the Fabry-Perot resonator to be shorter than this wavelength, it is necessary to make the thickness of the dielectric layer less than or equal to a value d indicated by the following equation:

$$d = \frac{\lambda_{res} - \Delta\lambda_{HW}}{2n}$$

where $\lambda_{res}$ denotes a plasmon resonance wavelength of the metal structures, n denotes a refractive index of the dielectric layer, and $\Delta\lambda_{HW}$ denotes a half width at half maximum of the resonance spectrum of the metal structures.

For example, when it is assumed that the resonance wavelength is 450 nm, the half width at half maximum of the resonance is 50 nm, and the refractive index is 1.46, d is calculated to be 137 nm. Therefore, to ensure that the Fabry-Perot resonator modes do not appear on the side of a wavelength shorter than 400 nm that is the shortest wavelength in the visible light region, the thickness of the dielectric layer can be made less than or equal to this value d.

In contrast, it is unsuitable for the dielectric layer thickness to be too thin, and it is favorable for the dielectric layer to have a certain degree of thickness. That is, it is suitable for the thickness 170 obtained by subtracting the thickness of the metal structures 120 from the thickness of the dielectric layer to be greater than or equal to the first length 141 or the second length 151 of the metal structures 120. Further, the thickness 170 can be at least around 100 nm.

This is because the spread of a near field that is generated by the metal structures 120 is typically around the size of the metal structures 120 itself or around 100 nm. If a space within a distance that is about the extent of a near-field region produced by the metal structures 120 from the metal structures 120 surface is occupied by a dielectric layer, it is possible to suppress the occurrence of a state in which foreign matter in mixed in the near-field region produced by the metal structures 120 and the optical characteristics of the metal structures 120 change.

(Calculation Results)

Figure 2:
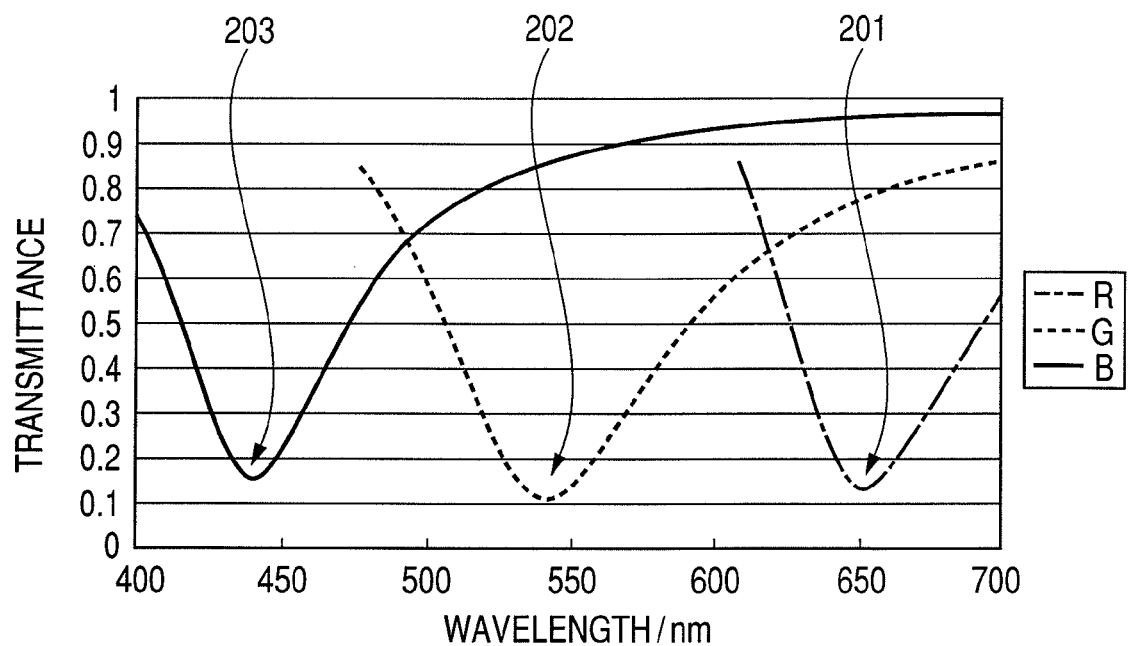
FIG. 2 is a diagram illustrating a transmission spectrum obtained by the first embodiment.

FIG. 2 is a view that illustrates results obtained by performing numerical calculations using the above described structure. More specifically, FIG. 2 illustrates results obtained using an optical filter that uses aluminum for metal structures that have a first length and a second length of 120 nm, are arranged at a period of 400 nm, and have a thickness of 30 nm. The transmission spectrum of this optical filter is illustrated by a transmission spectrum 201, and it is found that the filter functions as an optical filter that strongly absorbs light in the vicinity of a 650-nm wavelength.

Because the 650-nm wavelength is a band for red, the first letter of the word "Red" is used and the filter is referred to as "optical filter R". Since this optical filter reflects and absorbs wavelengths of red, the color cyan that is a complementary color of red can be observed as a transmission spectrum.

It is also possible to vary the wavelength, spectral bandwidth, and intensity of the transmission spectrum by varying the diameter or period of the metal structures.

For example, by making the length 100 nm, the period 310 nm, and the thickness 30 nm, an optical filter can be constructed that has a transmission spectrum 202 that has absorbance in the vicinity of green (wavelength 550 nm) in the visible range. This is referred to as "optical filter G". When the transmission spectrum of optical filter G is observed, the color magenta which is a complementary color of green can be observed.

Likewise, by making the length 70 nm, the period 250 nm, and the thickness 30 nm, an optical filter can be constructed that has a transmission spectrum 203 that has absorbance in the vicinity of blue (wavelength 450 nm) in the visible range. This is referred to as "optical filter B". When the transmission spectrum of filter B is observed, the color yellow which is a complementary color of blue can be observed.

In this connection, with respect to a reflection spectrum of the optical filter according to the present embodiment, the reflectance amounts to a maximal value in the vicinity of a wavelength at which the transmittance amounts to a minimal value. Therefore, the optical filter according to the present embodiment can also be used as a reflective filter, and not only as a transmission filter.

(Design Guidelines)

Hereunder, the relation between optical characteristics and parameters for configuring a metal structure group are described.

Localized surface plasmon resonance that is induced at a metal structure is an electric charge density distribution that accompanies plasma oscillations of free electrons inside the metal structure. The electric charge density distribution or optical characteristics of the metal structure are influenced by the shape of the structure.

For example, if the length of the metal structures in the direction of polarization of light irradiated on the metal structures is increased while keeping the length of the metal structures in a direction orthogonal to the direction of polarization, the thickness of the metal structures, and the period at which the metal structures are arranged constant, the resonance wavelength shifts to a long wavelength side.

Figure 17:
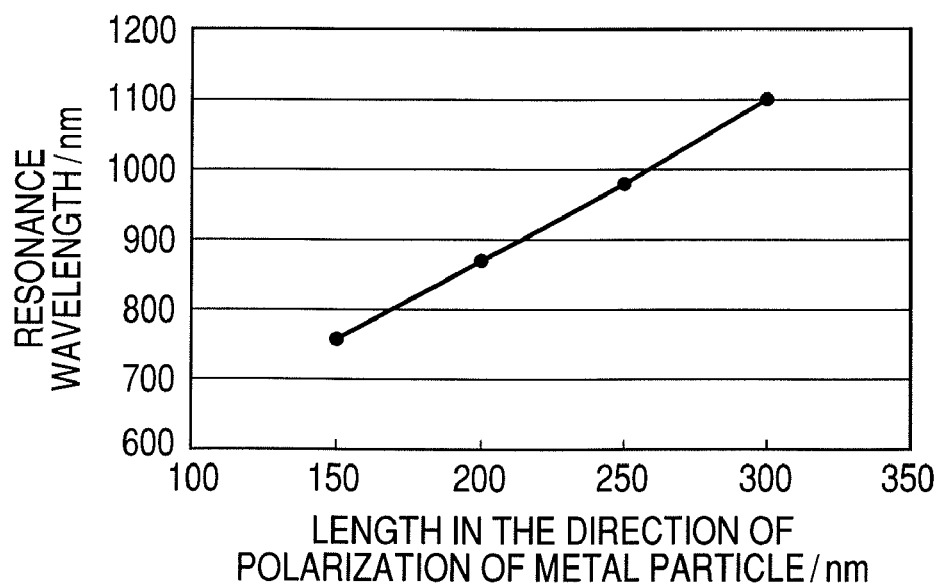
FIG. 17 is a view that illustrates the relationship between the length of a metal structure and a resonance wavelength.

It is thus found that in order to generate a wavelength of localized surface plasmon resonance of the metal structures on the long wavelength side, it is sufficient to increase the length in the direction of polarization of the metal structures. This tendency is illustrated in FIG. 17. Table 1 below illustrates the correspondence between the relation illustrated in FIG. 17 and peak width and transmittance.

TABLE 1

| Length in direction of polarization | Resonance wavelength | Peak width | Transmittance |
|---|---|---|---|
| 150 | 760 | 100 | 40 |
| 200 | 870 | 150 | 15 |
| 250 | 980 | 250 | 10 |
| 300 | 1100 | 410 | 5 |

Length in orthogonal direction to polarization fixed at 100 nm, thickness fixed at 50 nm, and period fixed at 500 nm According to Table 1, it is found that as the length in the direction of polarization of metal particles increases, not only does the resonance wavelength shift to a long wavelength, but the peak width broadens and the transmittance at the absorption peak decreases. In this connection, it is not always necessary that polarization of light incident on the optical filter is strictly along the direction of the length or the direction of the width of the metal particle.

Figure 19:
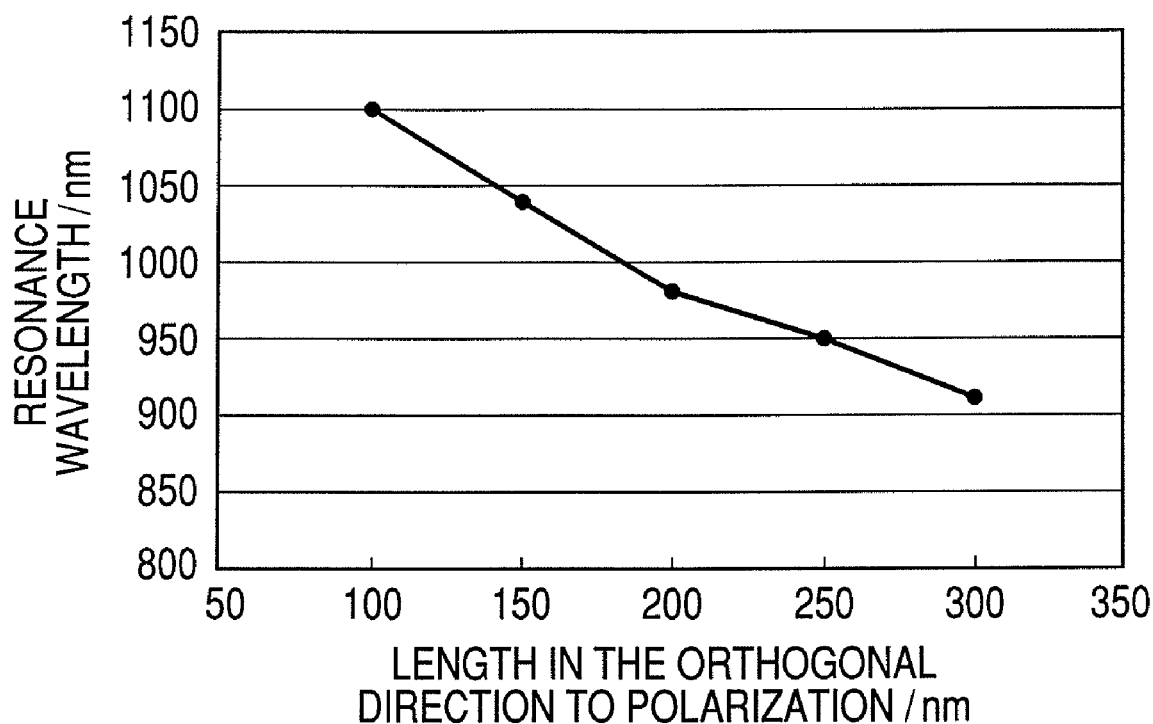
FIG. 19 is a view that illustrates the relationship between the length of a metal structure and a resonance wavelength.

Further, as shown in FIG. 19, as the length of metal structures in the orthogonal direction to polarization increases, the resonance wavelength shifts to a short wavelength side. Table 2 below illustrates the correspondence between the relation illustrated in FIG. 19 and peak width and transmittance.

TABLE 2

| Length in orthogonal direction to polarization | Resonance wavelength | Peak width | Transmittance |
|---|---|---|---|
| 100 | 1100 | 410 | 5 |
| 150 | 1040 | 450 | 4 |
| 200 | 980 | 515 | 3 |
| 250 | 950 | 545 | 2 |
| 300 | 910 | 550 | 2 |

Length in direction of polarization fixed at 300 nm, thickness fixed at 50 nm, and period fixed at 500 nm According to Table 2, it is found that as the length of the metal structures in the orthogonal direction to polarization increases, the resonance width broadens and the transmittance at the resonance wavelength tends to decrease.

Figure 20:
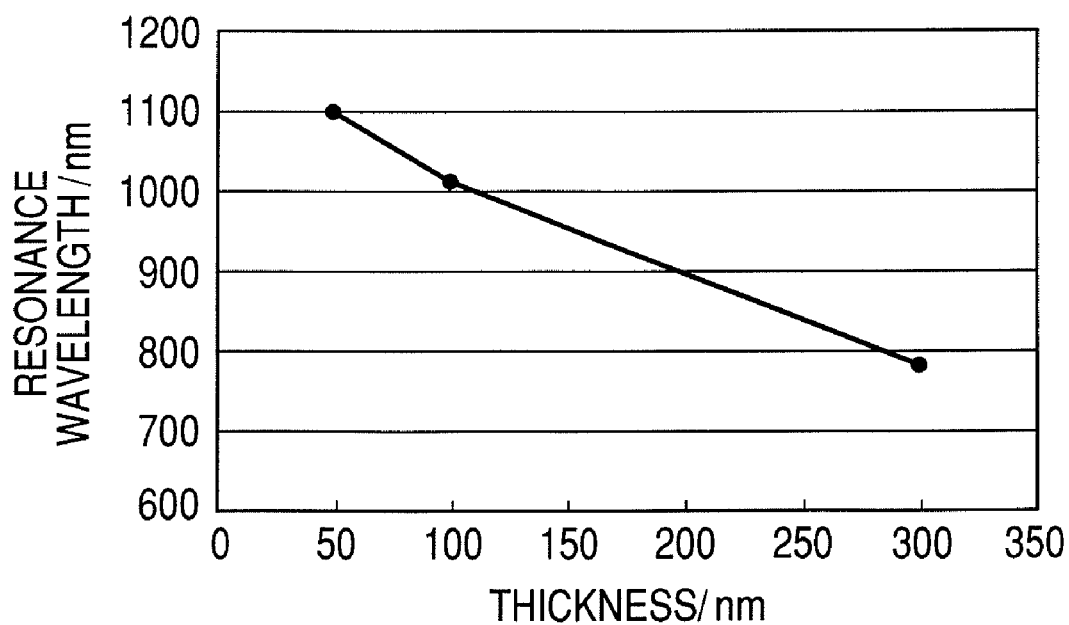
FIG. 20 is a view that illustrates the relationship between the thickness of a metal structure and a resonance wavelength.

FIG. 20 illustrates the relation between resonance wavelength and thickness. Further, Table 3 below illustrates the correspondence between the relation illustrated in FIG. 20 and peak width and transmittance.

TABLE 3

| Thickness | Resonance wavelength | Peak width | Transmittance |
|---|---|---|---|
| 50 | 1100 | 410 | 5 |
| 100 | 1010 | 370 | 4 |
| 300 | 777 | 285 | 1 |

Length in direction of polarization fixed at 300 nm, length in orthogonal direction to polarization fixed at 100 nm, and period fixed at 500 nm As shown in FIG. 20 and Table 3, it is found that when the thickness of the metal structures increases, the resonance wavelength becomes shorter, the transmittance at the resonance wavelength decreases, and the resonance width tends to decrease to some extent.

Figure 22:
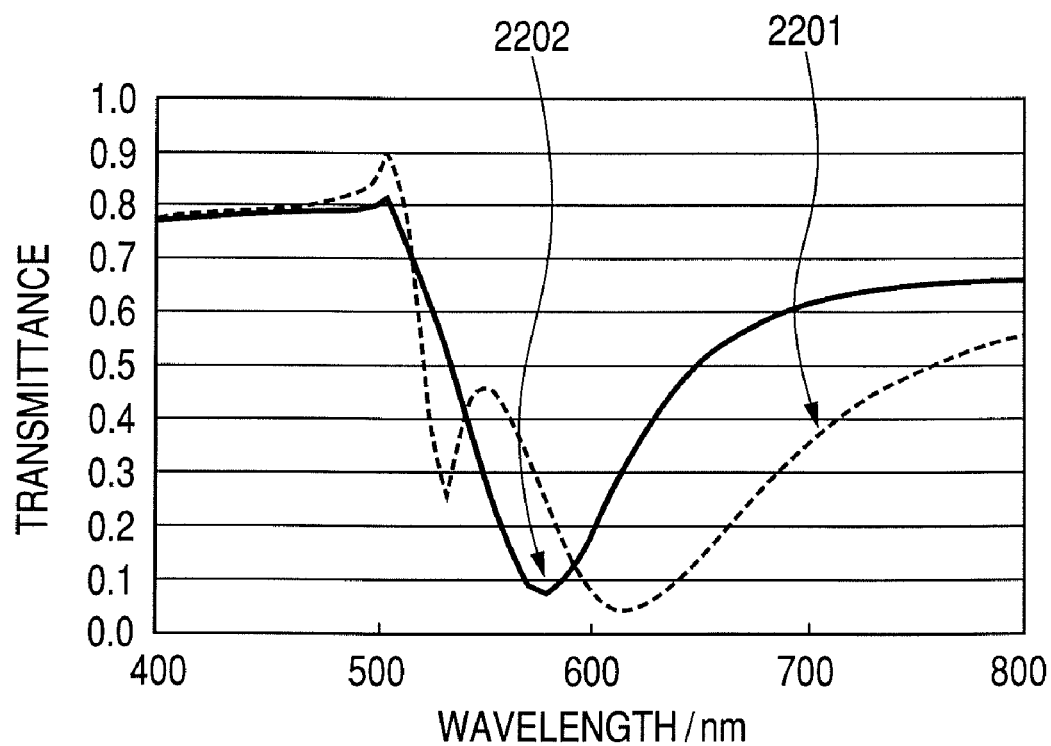
FIG. 22 is a view that shows the relationship between the wavelength and the transmittance.

Using these facts, as shown in FIG. 22, it is possible to improve the spectrum shape from the transmission spectrum 2201 to the transmission spectrum 2202.

In the transmission spectrum 2201, a sharp dip due to Wood's anomaly is present in the spectrum in the vicinity of wavelength 530 nm. The transmission spectrum 2201 is an optical spectrum in a case where square metallic dots with sides measuring 150 nm in length comprising aluminum of a film thickness of 90 nm are arranged at periods of 400 nm in an equilateral triangular lattice shape. On the other hand, the transmission spectrum 2202 is an optical spectrum in a case in which the film thickness is increased to 150 nm.

More specifically, by shifting a resonance wavelength of a dot array to the short wavelength side and overlapping with a sharp dip of Wood's anomaly as a result of increasing the film thickness, the spectrum shape can be made to have a single peak and the resonance width can be made to comprise a narrower band.

By making the metal film thickness a predetermined value in this manner, it is also possible to hide a dip that is not preferable in terms of the spectrum.

Figure 21:
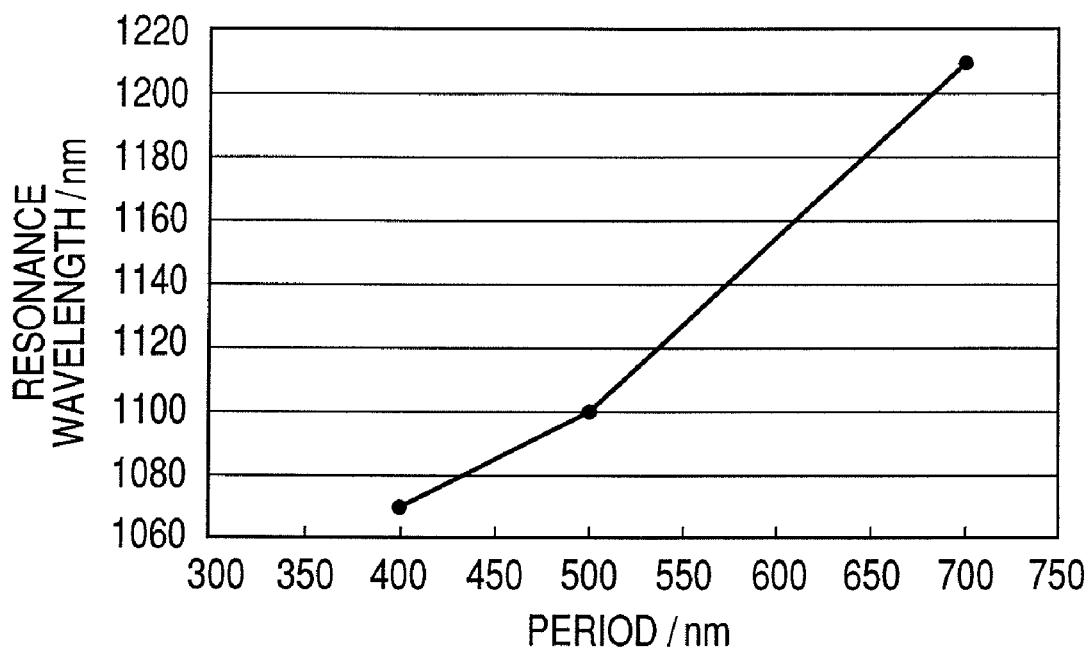
FIG. 21 is a view that illustrates the relationship between the period of metal structures and a resonance wavelength.

FIG. 21 illustrates the relation between resonance wavelength and period. Further, Table 4 below illustrates the correspondence between the relation illustrated in FIG. 21 and peak width and transmittance.

TABLE 4

| Arrangement period | Resonance wavelength | Peak width | Transmittance |
|---|---|---|---|
| 400 | 1070 | 650 | 2 |
| 500 | 1100 | 410 | 5 |
| 700 | 1210 | 200 | 15 |

Length in direction of polarization fixed at 300 nm, length in orthogonal direction to polarization fixed at 100 nm, and thickness fixed at 50 nm As shown in FIG. 21 and Table 4, it is found that when the period at which metal structures are arranged increases, the resonance wavelength becomes longer, the transmittance at the resonance wavelength increases, and the resonance width tends to decrease.

Based on these findings, it is possible to attempt to optimize the parameters for metal structures and a metal structure group, and it is also possible to design an optical filter having a resonance wavelength at a desired wavelength.

According to the studies of the inventors of the present invention, in order to make the resonance wavelength of an optical filter that of the red band (550 nm or more to less than 650 nm), it is necessary to set the first length and the second length of the metal structures in a range from 110 nm or more to 160 nm or less. Further, it is necessary to set the thickness of the metal structures in a range from 10 nm or more to 200 nm or less, and to set the period in a range from 340 nm or more to 450 nm or less.

Further, in order to make the resonance wavelength of the optical filter that of the green band (450 nm or more to less than 550 nm), it is necessary to set the first length and the second length of the metal structures in a range from 90 nm or more to less than 130 nm. Further, it is necessary to set the thickness of the metal structures in a range from 10 nm or more to 200 nm or less, and to set the period at which the metal structures are arranged in a range from 260 nm to 340 nm, and preferably a range from 270 nm to 330 nm.

Furthermore, in order to make the resonance wavelength of the optical filter that of the blue band (350 nm or more to less than 450 nm), it is necessary to set the first length and the second length of the metal structures in a range from 60 nm or more to less than 100 nm. Further, it is necessary to set the thickness of the metal structures in a range from 10 nm or more to 200 nm or less, and to set the period at which the metal structures are arranged in a range from 180 nm or more to 280 nm or less, and preferably a range from 200 nm to 270 nm.

The optical filter of the present embodiment thus has an absorbance or reflectance peak of wavelength in the visible light region, as explained above. On the other hand, the reducing of the size of the metal structure and the periphery from the designed values regarding the visible light region can realize the optical filter for near-ultraviolet region. Also the increasing of the size of the metal structure and the periphery can realize the optical filter for near-infrared region.

Second Embodiment

Bayer Array

According to the present embodiment, an RGB filter arranged in a Bayer array is described.

Figure 3:
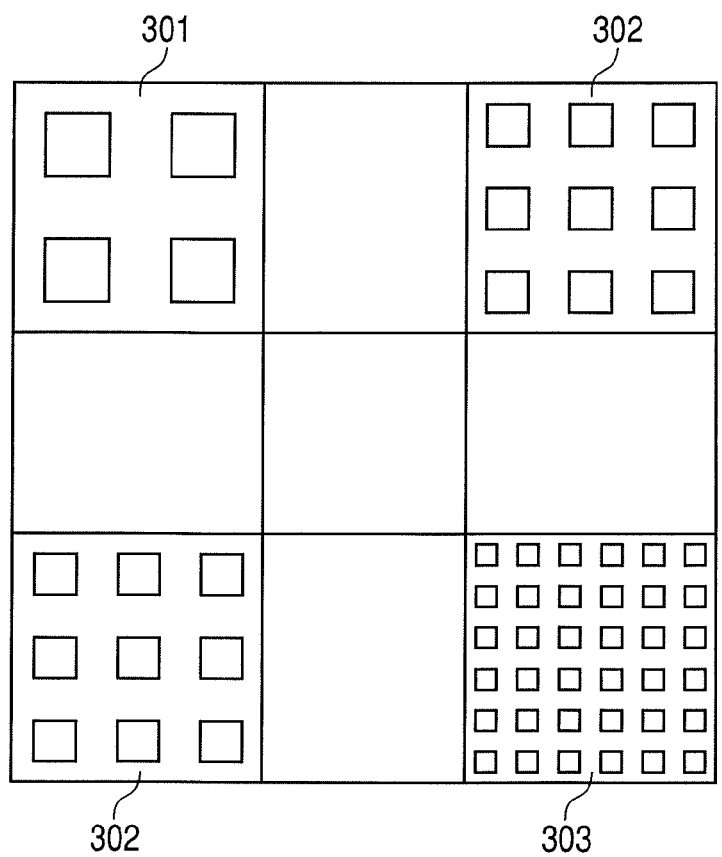
FIG. 3 is a schematic diagram illustrating a second embodiment.

In FIG. 3, for example, the aforementioned optical filter R (transmission spectrum 201) is arranged in a region 301, the optical filter G (transmission spectrum 202) is arranged in a region 302, and the optical filter B (transmission spectrum 203) is arranged in a region 303. By arranging the optical filters in this manner, it is possible to construct a color filter that is arranged in a Bayer array using the filters according to the present invention.

The above color filter can be used as a color filter for image capturing device. Region 301 etc. of the color filter has an area corresponding to one pixel, which may be greater than an area covered by the photoelectric conversion device (photoelectric conversion part).

According to the present embodiment, the sizes of the metal structures and the periods at which the metal structures are arranged differ for each region. However, the present embodiment is not limited to this configuration. For example, metal structure groups with respect to which only the periods at which the metal structures are arranged are different may be arranged in each region. Further, metal structure groups with respect to which only the sizes of the metal structures are different may be arranged in each region.

That is, a configuration may be adopted which includes two or more first metal structure groups, in which periods at which the first metal structures are arranged are different, and in which the first metal structure groups are arranged in different regions of the dielectric substrate surface.

Further, a second metal structure group comprising second metal structures that are a different shape to the first metal structures that constitute the first metal structure group may be arranged in each region. More specifically, the second metal structures have a third length in a first direction and a fourth length in a second direction, and the third length is different to the first length of the first metal structures or the fourth length is different to the second length of the first metal structures. The third and fourth lengths are preferably equal to or less than the second wavelength.

As a result, the second metal structure group can decrease the transmittance of light at a wavelength (second wavelength) that is different to the resonance wavelength (first wavelength) of the first structure group.

In the present specification, the terms "first metal structure group" and "second metal structure group" refer to the fact that the shape of metal structures constituting the respective structure groups are different. More specifically, even if the periods at which metal structures are arranged are different, as long as the shapes of the metal structures are the same the term "first metal structure group" is used. Further, if the shape of the metal structures is different, the term "second metal structure group" is used regardless of whether the periods are the same or different.

Third Embodiment

Triangular Lattice

Figure 16:
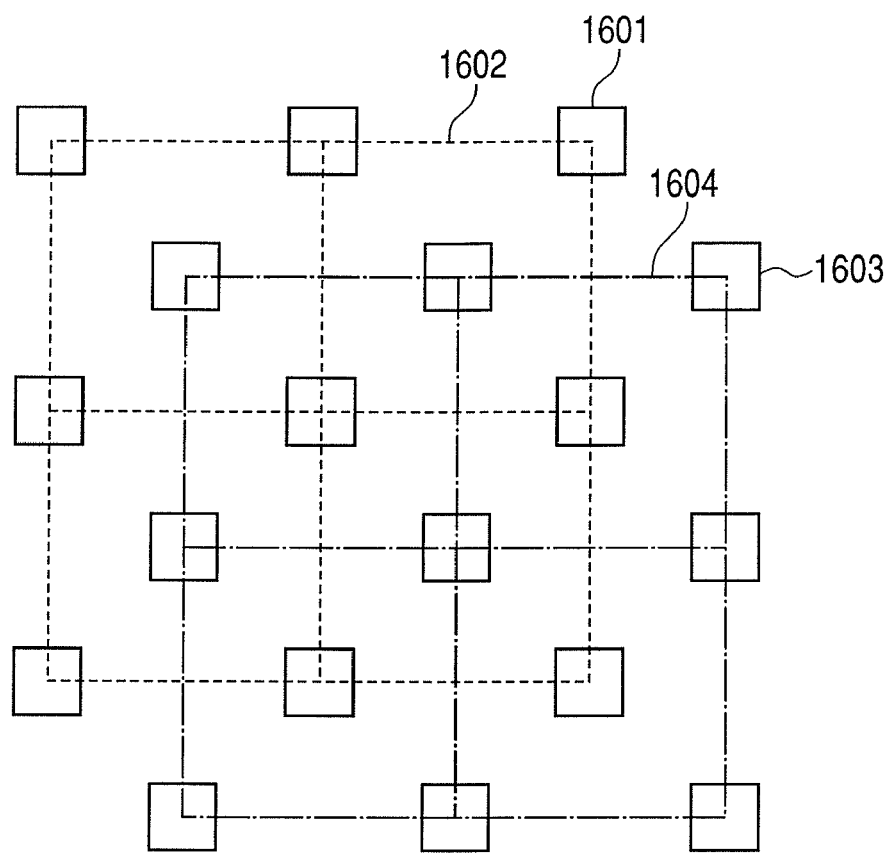
FIG. 16 is a schematic diagram that illustrates a third embodiment.

FIG. 16 is a view that illustrates an embodiment in which metal structures are arranged in a triangular lattice shape. In the case of a triangular lattice arrangement, since the unit vector components of the lattice are not orthogonal, it is possible to reduce the dependence with respect to incident light polarization of the optical characteristics of the filter in comparison to a tetragonal lattice shape arrangement.

This kind of triangular lattice arrangement can also be expressed as a plurality of metal structure group arranged in a tetragonal lattice shape being disposed in overlapping regions.

More specifically, it is possible to express this arrangement in terms of a first metal structure group 1602 including first metal structures 1601 and a second metal structure group 1604 including second metal structures 1603 being arranged in overlapping regions.

Fourth Embodiment

Overlapping of Two or More Structure Groups

According to the present embodiment, similarly to the third embodiment, an example is described in which a plurality of metal structure groups are overlappingly arranged.

Figure 4A:
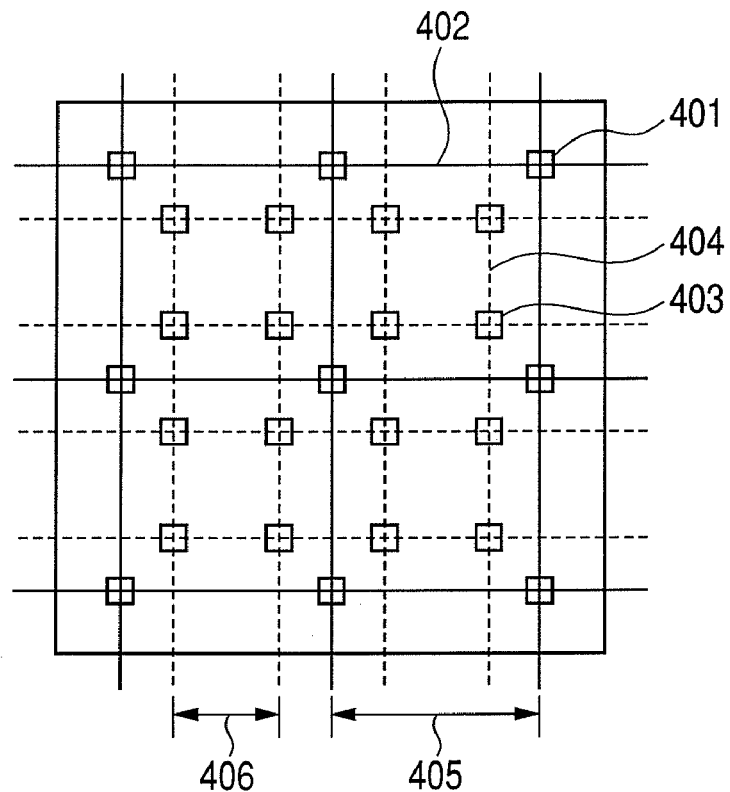
FIGS. 4A and 4B are schematic diagrams that illustrate a fourth embodiment.

FIG. 4A is a view that illustrates a case in which first metal structure groups with different periods are overlappingly arranged. First metal structures 401 that constitute a first metal structure group 402 are arranged at a period 405, while first metal structures 403 that constitute a first metal structure group 404 are arranged at a period 406. Thus, according to the present embodiment, because the arrangement periods of the metal structures are different to each other, it is possible to simultaneously manifest the respective optical characteristics of the two metal structure groups.

That is, the optical filter illustrated in FIG. 4A includes two or more of the aforementioned first metal structure groups in the in-plane direction of the dielectric substrate, and periods at first structures that constitute the two or more first metal structure groups are arranged are mutually different. Further, the two or more first metal structure groups are arranged in overlapping regions.

Figure 4B:
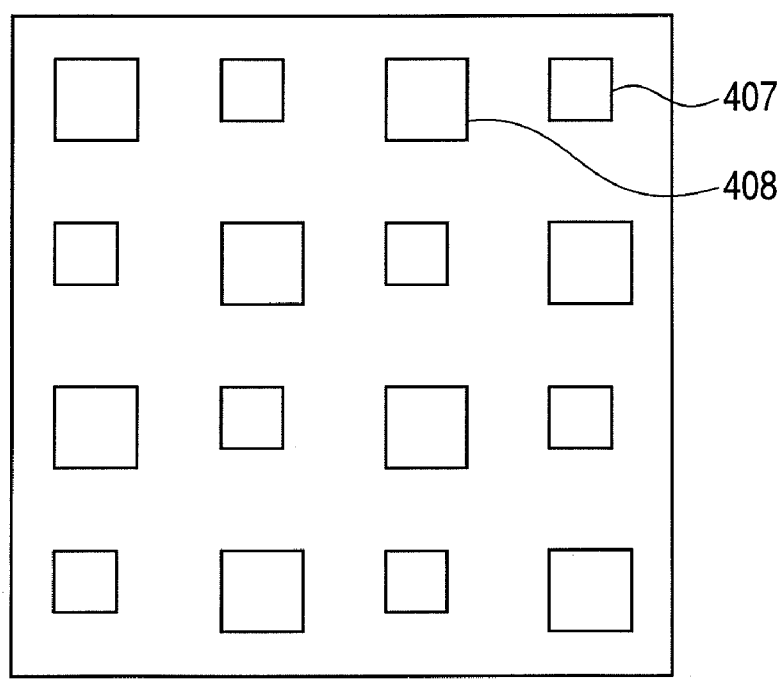

FIG. 4B is a view that illustrates a case in which first metal structures and second metal structures are arranged in overlapping regions. First metal structures 407 constitute a first metal structure group, and second metal structures 408 constitute a second metal structure group. Thus, because the shapes of the metal structures constituting the metal structure groups are different, it is possible to simultaneously manifest the respective optical characteristics of the two metal structure groups.

More specifically, in addition to the first metal structure group, the optical filter illustrated in FIG. 4B includes a second metal structure group in which a plurality of second metal structures are two-dimensionally and periodically in an isolated state in the in-plane direction of the dielectric substrate. The second metal structures have a third length in a first direction and a fourth length in a second direction, and the third length and the fourth length are less than or equal to the second wavelength different from the first wavelength. The third length is different to the first length, or the fourth length is different to the second length, and the first metal structure group and the second metal structure group are arranged in overlapping regions. As a result, a resonance wavelength (first wavelength) of the first metal structures and a resonance wavelength (second wavelength) of the second metal structures are different.

Fifth Embodiment

Single-Row Filter

The present embodiment describes a single-row filter.

Figure 5:
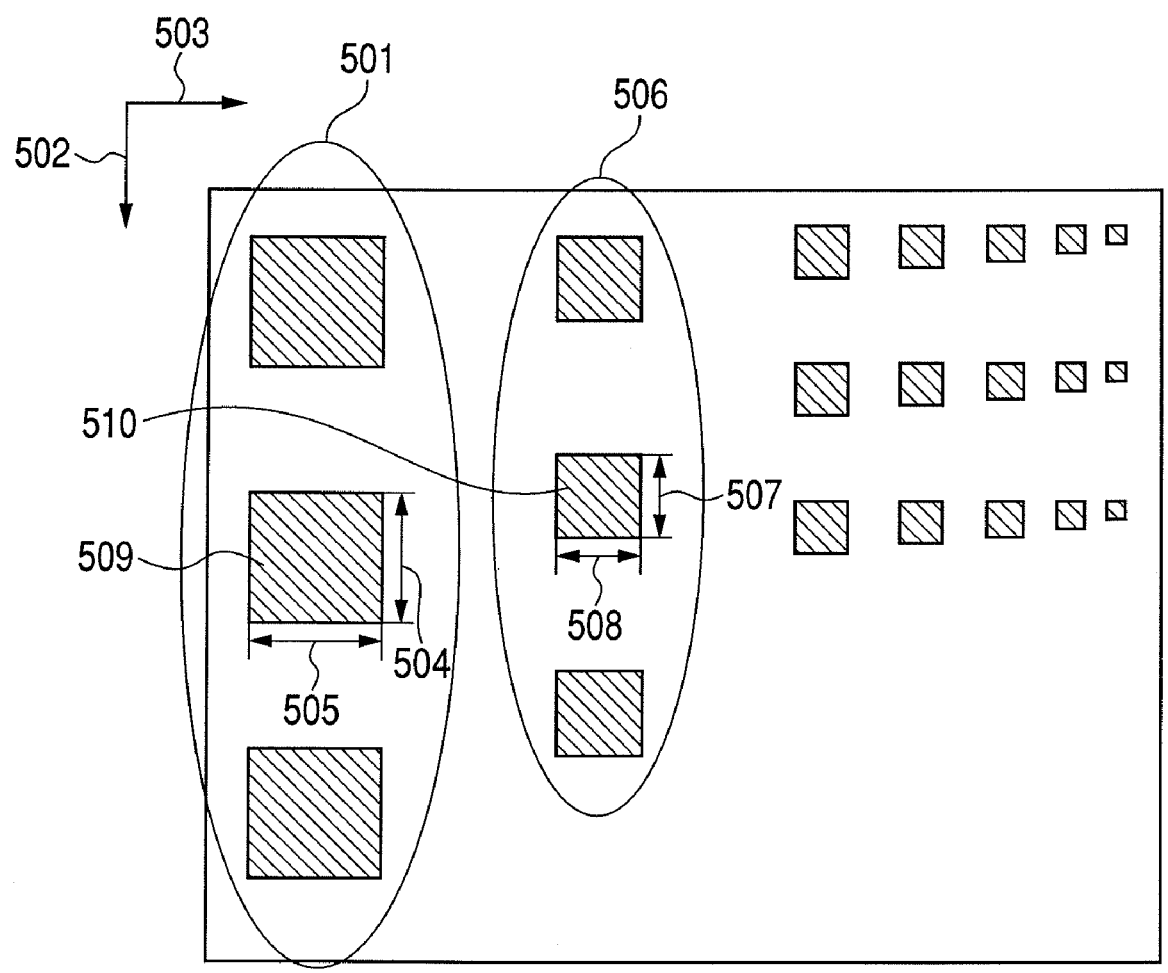
FIG. 5 is a schematic diagram illustrating a fifth embodiment.

In FIG. 5, first metal structures 509 have a first length 504 in a first direction 502, and have a second length 505 in a second direction 503 that is an orthogonal direction to the first direction 502. The first metal structures 509 are periodically arranged in the first direction 502 to thereby constitute a first metal structure group 501.

Further, second metal structures 510 have a third length 507 in the first direction 502, and have a fourth length 508 in the second direction 503. The second metal structures 510 are periodically arranged in the first direction 502 to thereby constitute a second metal structure group 506.

The metal structure groups 501 and 506 generate plasmon resonance with respect to light of respectively different wavelengths. It is therefore possible to decrease the transmittance of light of different wavelengths. Therefore, with respect to the optical filter having the structure shown in FIG. 5, since wavelengths at which the transmittance decreases vary depending on the irradiation position of light, the filter can be used for light dispersion and the like.

Figure 6:
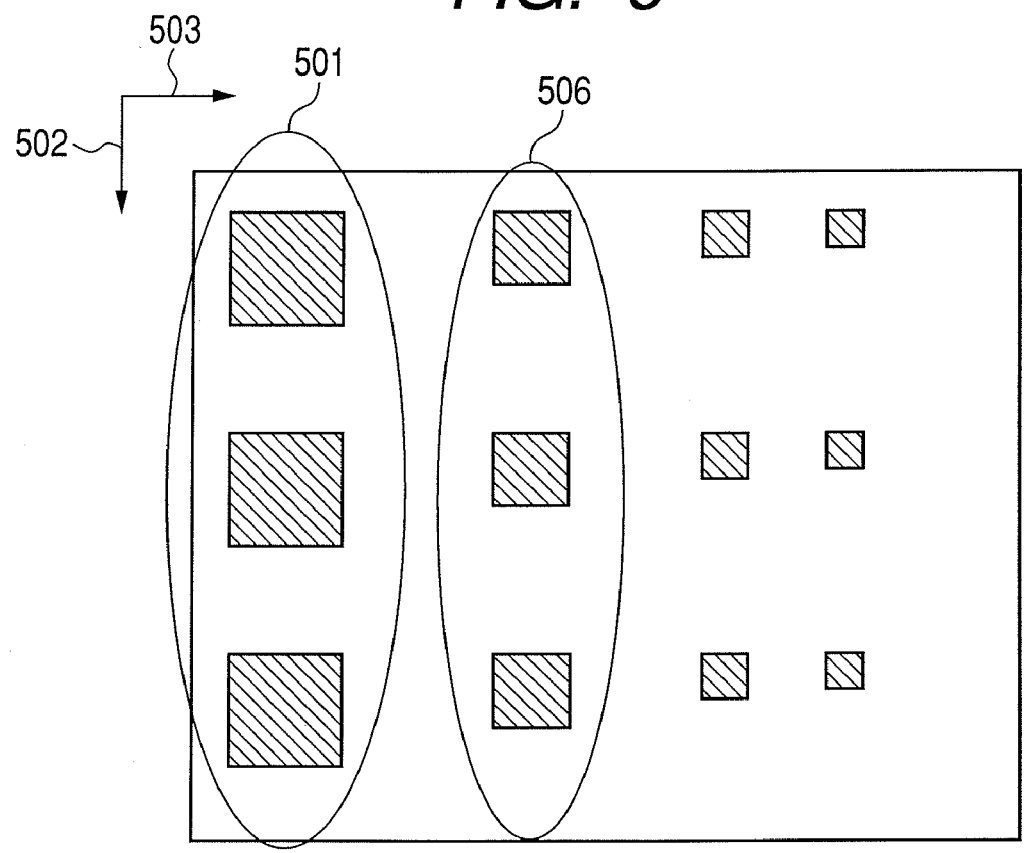
FIG. 6 is a schematic diagram illustrating the fifth embodiment.

In this connection, although in the configuration shown in FIG. 5 the period of the metal structures 509 in the first direction is different to the period of the metal structures 510 in the first direction, as shown in FIG. 6, the periods may be the same.

That is, the optical filter according to the present embodiment includes a first metal structure group and a second metal structure group which have a plurality of metal structures that are arranged in an isolated state in the in-plane direction of the dielectric substrate. The first metal structure group and the second metal structure group are arranged in different regions on the dielectric substrate surface. The first metal structures are periodically arranged in the first direction. The first length and the second length of the first metal structures are a length that is less than or equal to the first wavelength. Further, the second metal structures constituting the second metal structure group are periodically arranged in the first direction. The second metal structures have a third length in the first direction and have a fourth length in the second direction. The third length and the fourth length are lengths that are less than or equal to the second wavelength different from the first wavelength. The first length and the third length are different, or the second length and the fourth length are different. As a result, a resonance wavelength (first wavelength) of the first metal structures is different to a resonance wavelength (second wavelength) of the second metal structures.

Sixth Embodiment

Laminated Optical Filter

The present embodiment describes a laminated optical filter.

Figure 7:
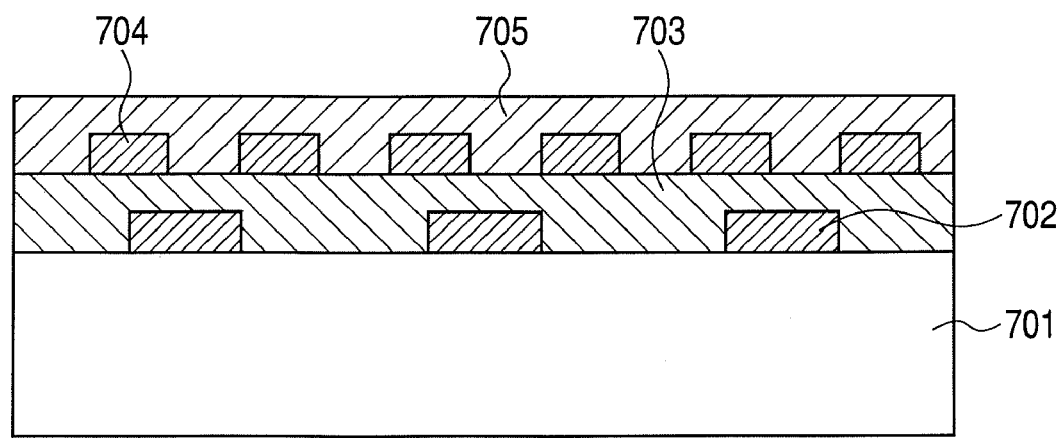
FIG. 7 is a schematic diagram illustrating a sixth embodiment.

In FIG. 7, a first metal structure group 702 is formed on a dielectric substrate 701, and this is covered with a first dielectric layer 703. Further, a third metal structure group 704 is arranged on the first dielectric layer 703, and a second dielectric layer (other dielectric layer) 705 is formed thereon.

Thereby, it is also possible to make an optical filter with a transmission spectrum that is represented by the product of the transmission spectrum 201 and the transmission spectrum 203 that are illustrated in FIG. 2. For example, by laminating filters of the optical filter R and the optical filter B, an optical filter can be made that has a transmission spectrum of the product of the transmittance of the optical filter R and the optical filter B. In this filter, the maximum value of transmittance arises in the vicinity of the 550-nm wavelength. Thus, by laminating filters that function as filters of complementary colors when in a single layer, it is also possible to make the filters function as filters of primary colors.

The configurations of the first metal structure group 702 and the third metal structure group 704 differ with respect to the period of in-plane arrangement or the shape of the metal structures.

Because the configurations of the first metal structure group 702 and the third metal structure group 704 are different, each of these layers generate plasmon resonance at mutually different wavelengths. As a result, in the optical filter of the present embodiment, the transmittance with respect to at least two wavelengths is minimal.

That is, this fact means that the optical filter of the present embodiment includes a function as a bandpass filter allows the passage of wavelengths between the aforementioned two minimal wavelengths.

Accordingly, although the first metal structure group 702 and the third metal structure group 704 that are a single layer, respectively, have a function as a complementary color filter, by adopting a configuration in which these two metal structure groups are laminated, it is possible to manifest a function of a primary color filter that combines the characteristics of both metal structure groups.

More specifically, the laminated optical filter according to the present embodiment is a laminated optical filter in which another dielectric layer is formed on a dielectric layer surface. Further, the laminated optical filter includes between the dielectric layer surface and the other dielectric layer, a third metal structure group in which a plurality of third metal structures are two-dimensionally and periodically arranged in an isolated state in an in-plane direction of the dielectric layer surface. A third metal structure comprising the third metal structure group includes a fifth length in a first direction and a sixth length in a second direction, and the fifth length and the sixth length are lengths that are less than or equal to the third wavelength different from the first wavelength. The first length and the fifth length are different or the second length and the sixth length are different, or a period at which the third metal structures are arranged and a period at which the first metal structures are arranged are different. Therefore, the third metal structure group can decrease transmittance at a resonance wavelength (third wavelength) that is different to a resonance wavelength (first wavelength) of the first structure group.

In this connection, for the laminated optical filter of the present embodiment, a form can be adopted in which dielectric layers are laminated at a lamination interval at which near-field interaction almost does not arise. More specifically, the lamination interval can be 100 nm or more.

Example 1

In Example 1, a method of producing absorbance/reflective filters for red, green, and blue (RGB) and the optical characteristics thereof are described.

Figure 8A:
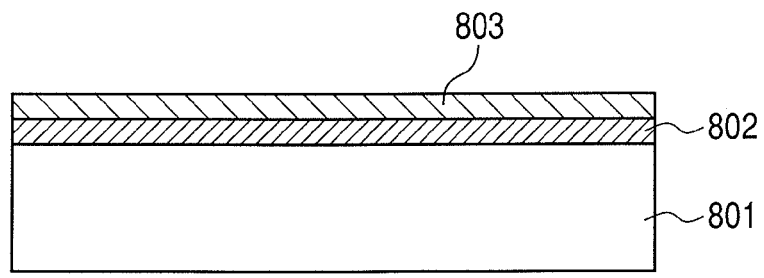
FIGS. 8A, 8B and 8C are schematic diagrams of an optical filter according to Example 1.

FIG. 8A is a view that illustrates a structure formed by depositing aluminium of a thickness of 30 nm as a metallic thin film layer 802 on the surface of a dielectric substrate 801 comprising a quartz substrate of a thickness of 525 µm, and then coating a resist for electron beam (EB) lithography 803 thereon. The method of forming the metallic thin film layer 802 is not limited to deposition, and may be sputtering or the like.

Next, the resist 803 is subjected to patterning using an EB lithography apparatus. The resist pattern is formed in a shape in which squares with sides of approximately 120 nm are arranged in a tetragonal lattice shape at a period of approximately 400 nm. By performing dry etching with plasma comprising a gaseous mixture of chlorine and oxygen using this resist pattern as an etching mask, metallic thin film structures 804 can be formed. The dry etching gas is not limited to chlorine and oxygen, and may be argon or another gas.

A method of preparing an etching mask is not limited to EB lithography, and may be photolithography or the like. Further, a method of patterning the metallic thin film layer 802 may be one in which a resist pattern is formed by EB lithography or photolithography on the dielectric substrate 801, and a lift-off process is then performed after forming the metallic thin film layer 802. In addition, the metallic thin film layer 802 may be formed by direct processing using a focused ion beam processing apparatus (FIB processing apparatus).

Figure 8B:
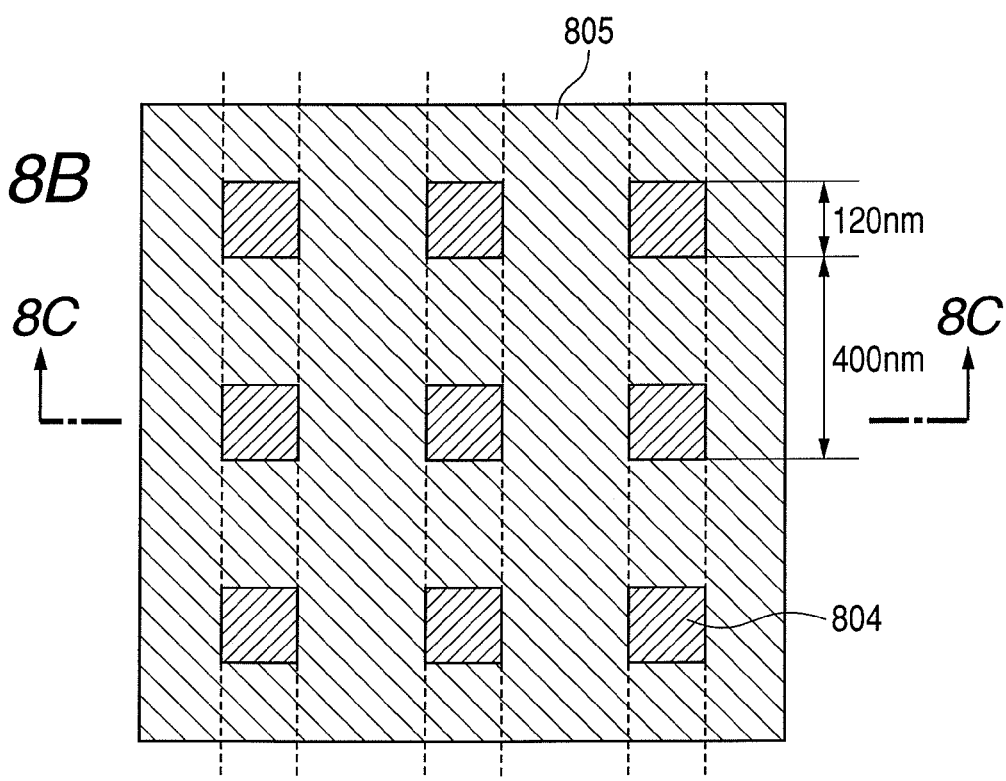
Figure 8C:
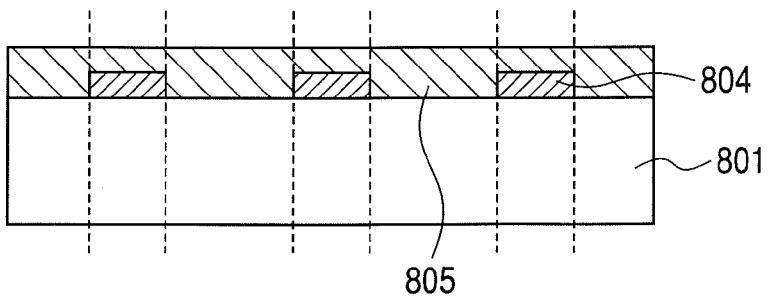

Next, a quartz thin film with a thickness of 300 nm is formed as a dielectric layer 805 on the metallic thin film structures 804 by sputtering. The optical filter formed in this manner is illustrated in FIG. 8B. In this connection, the method of forming the film is not limited to sputtering, and film formation may be performed by CVD or by applying SOG or the like.

Figure 9A:
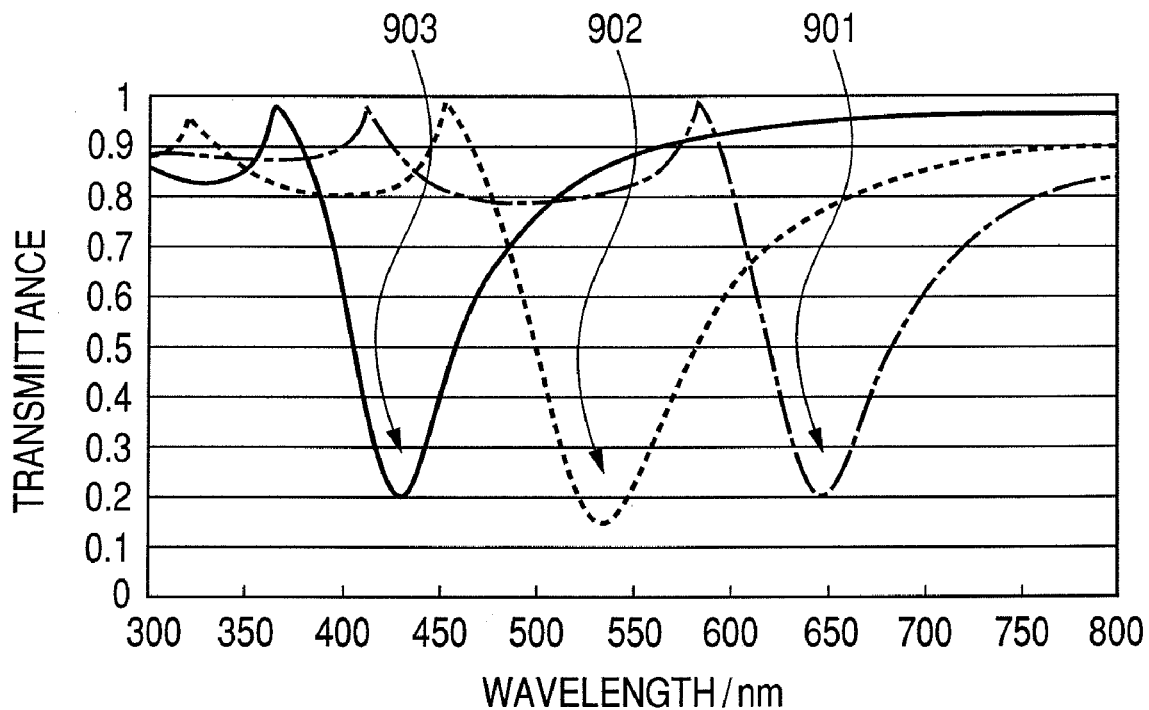
FIGS. 9A and 9B are diagrams that illustrate transmission spectra obtained by the optical filter according to Example 1.

FIG. 9A illustrates transmission spectra of an optical filter manufactured in this manner. A transmission spectrum R is determined as denoted by reference numeral 901 by numerical calculation, and it is found that the present filter has a minimum value (absorption peak) of transmittance in the vicinity of the 650-nm wavelength. Since the wavelength showing an absorption peak corresponds to red in the visible range, it is found that the present filter functions as a complementary color filter that absorbs red.

Further, by making the diameter of the metallic thin film structures 804 approximately 100 nm, the thickness approximately 30 nm, and the period at which the metallic thin film structures 804 are arranged approximately 310 nm, a transmission spectrum G denoted by reference numeral 902 is obtained. Likewise, by making the diameter of the metallic thin film structures 804 approximately 70 nm, the thickness approximately 30 nm, and the period at which the metallic thin film structures 804 are arranged approximately 250 nm, a transmission spectrum B denoted by reference numeral 903 is obtained. These are optical filters that absorb RGB, and function as complementary color filters.

Further, with regard to a reflection spectrum of a filter of the present example, the reflectance is greatest at a wavelength that is substantially the same as the wavelength at which transmittance is minimal.

Figure 9B:
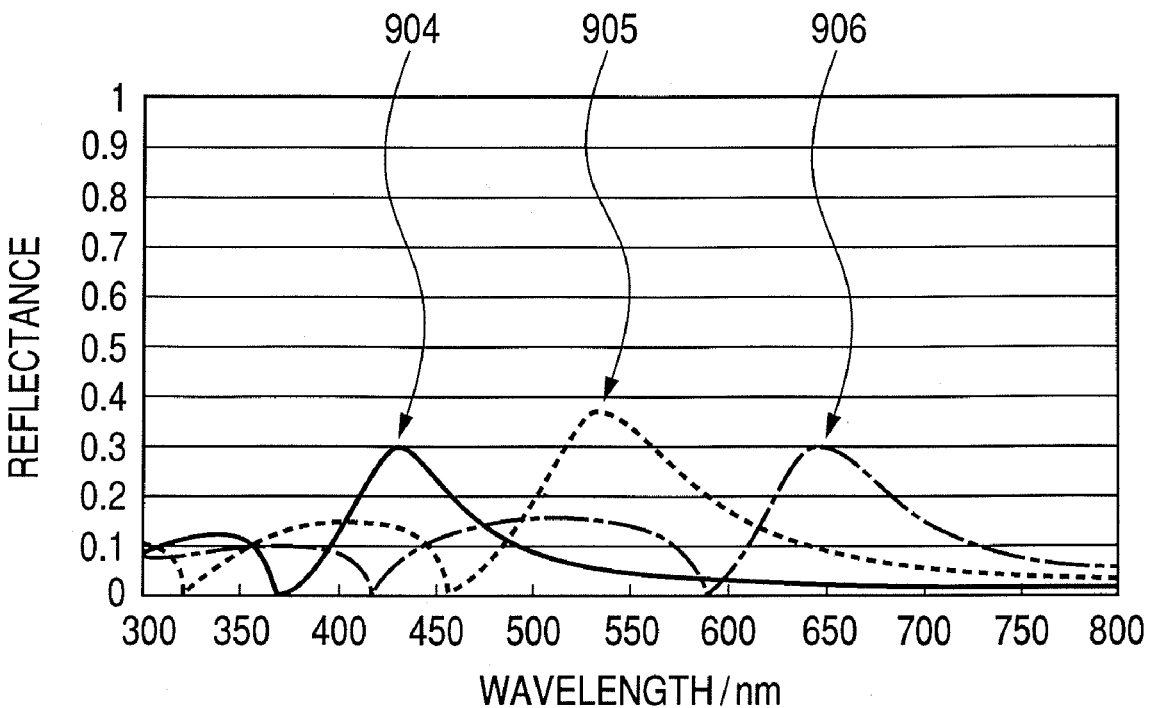

Therefore, as shown in FIG. 9B, by using an optical filter of the present example as a reflective filter, a reflection spectrum R that is denoted by reference numeral 904 can be obtained from the filter that has the transmission spectrum R. Likewise, a reflection spectrum G that is denoted by reference numeral 905 can be obtained from the filter that has the transmission spectrum G, and a reflection spectrum B that is denoted by reference numeral 906 can be obtained from the filter that has the transmission spectrum B. Thus, these optical filters can be made to function as optical filters that strongly reflect red, green, and blue of the visible range, respectively.

Although the present example was described using an example in which metal structures are arranged in a tetragonal lattice shape, the metal structures may be arranged in a triangular lattice arrangement.

Further, the thickness of the dielectric layer 805 is not limited to 300 nm, and the dielectric layer 805 may be thinner than 300 nm. To enable the width of a near-field region generated by the metal structures to be covered by the dielectric layer, it is suitable that the thickness is about 100 nm or more.

Example 2

Figure 10A:
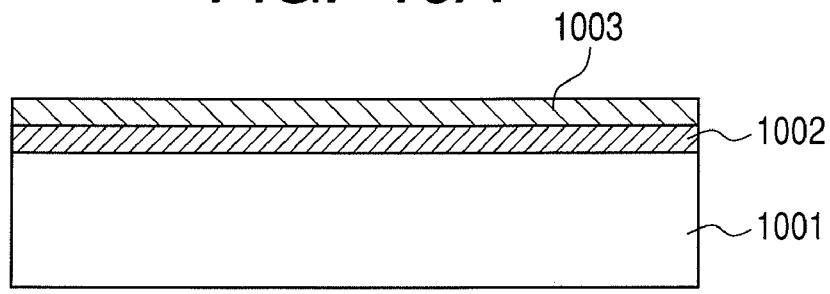
FIGS. 10A, 10B and 10C are schematic diagrams of an optical filter according to Example 2.

In Example 2, a method of producing an RGB filter arranged in a Bayer array and the optical characteristics thereof are described. FIG. 10A is a view that illustrates a structure formed by depositing aluminium of a thickness of 20 nm as a metallic thin film layer 1002 on the surface of a dielectric substrate 1001 comprising a quartz substrate with a thickness of 525 µm, and then coating a resist 1003 thereon.

Figure 10B:
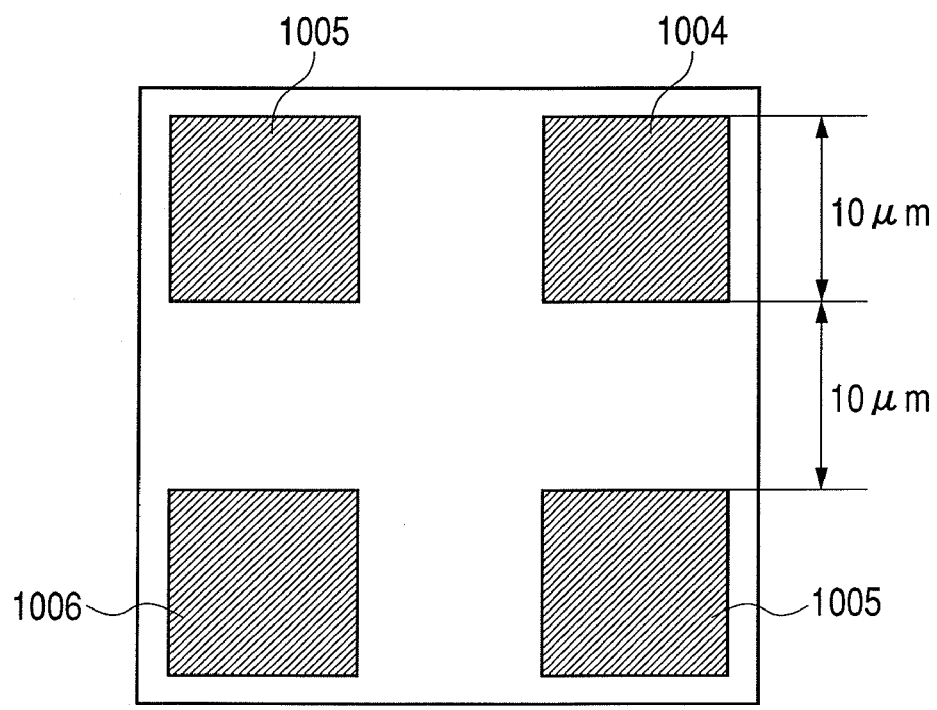

Next, the resist 1003 is subjected to patterning using an EB lithography apparatus. Regarding the shape of the resist pattern, a portion in which shapes formed by arranging squares having sides of approximately 130 nm in a tetragonal lattice shape at a period of approximately 380 nm are patterned at an approximately 10 µm angle is taken to be a pattern portion A 1004. Further, a shape formed by arranging squares having sides of approximately 110 nm in a tetragonal lattice shape at a period of approximately 280 nm is taken to be a pattern portion B 1005. Furthermore, a shape formed by arranging squares having sides of approximately 80 nm in a tetragonal lattice shape at a period of approximately 200 nm is taken to be a pattern portion C 1006. A structure is prepared in which each of these pattern portions are arranged as shown in FIG. 10B with a clearance of 10 µm left between the respective pattern portions. Metallic thin film structures 1007 are prepared by dry etching with plasma comprising a gaseous mixture of chlorine and oxygen using this resist pattern as an etching mask.

Figure 10C:
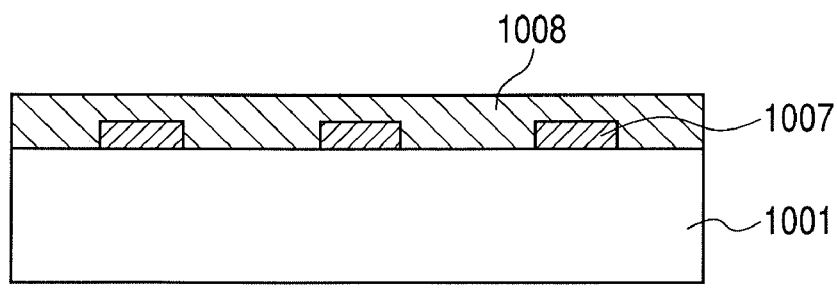

Next, a quartz thin film with a thickness of 500 nm is formed as a dielectric layer 1008 on the metallic thin film structures 1007 by sputtering. An optical filter formed in this manner is shown in FIG. 10C.

In this connection, a light-shielding layer may be formed in the regions between the above described pattern portions to prevent color mixing. Further, when the thickness of the metal structures comprising each pattern portion is made the same, as in the present example, it is possible to manufacture each pattern portion within the same process and it is also possible to eliminate boundary lines between the pattern portions.

Figure 11:
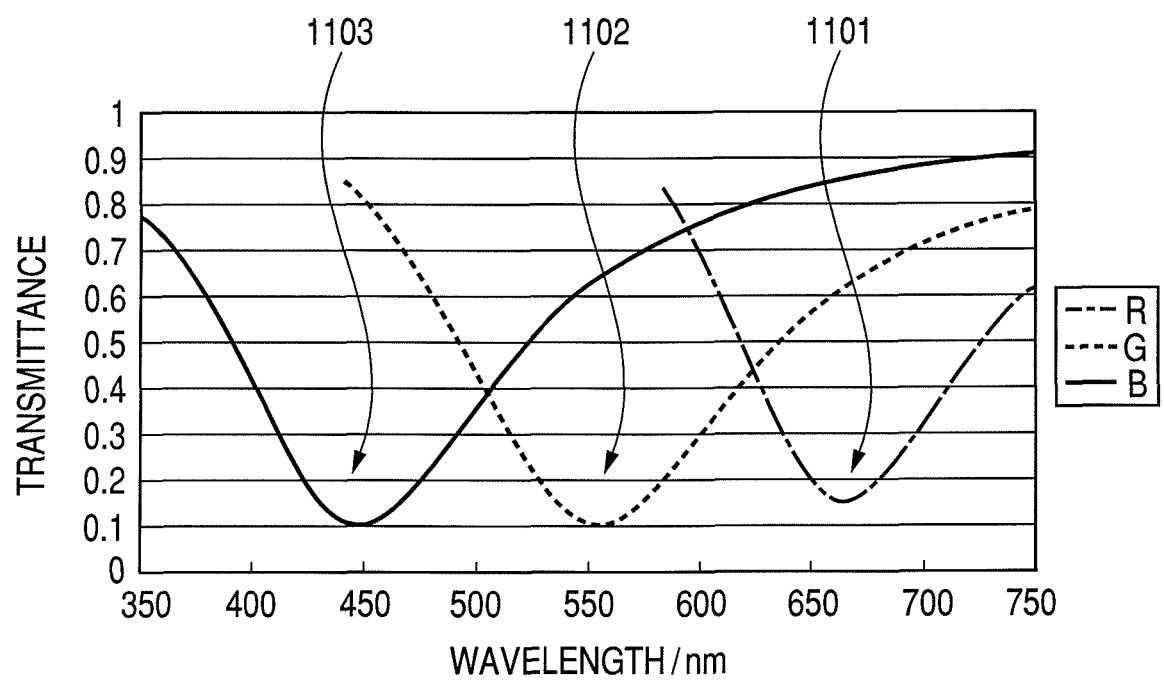
FIG. 11 is a diagram that illustrates transmission spectra obtained by the optical filter according to Example 2.

As shown in FIG. 11, the pattern portions A, B, and C prepared in this manner have a transmission spectrum R denoted by reference numeral 1101, a transmission spectrum G denoted by reference numeral 1102, and a transmission spectrum B denoted by reference numeral 1103. These can function as complementary color filters with respect to red, green, and blue, respectively. Further, by making the thickness the same for all the pattern portions as in the present example, complementary color filters for red, green and blue can be manufactured in the same batch.

The optical filter using the metal structure of the present example has a constitution which enables a plurality of the optical filter different in absorbed wavelength or reflected wavelength to be simultaneously fabricated by merely changing the size of structure or periphery of the arrangement, even if they are the same in thickness.

Generally speaking, it is necessary for fabricating a colorant filter array, which is a general optical filter, to apply kinds of colorants separately through their respective processes. On the other hand, the constitution of the optical filter of the present example enables the optical filters different in wavelength to be fabricated through the same process, whereby the cost of the fabrication can be reduced. The thickness of the dielectric layer 1008 is not limited to 500 nm. For example, to ensure that a FSR of 100 nm or more can be secured in the blue wavelength region (450-nm wavelength), it is suitable that the thickness of the dielectric layer is approximately 690 nm or less when the refractive index thereof is 1.46. Further, to enable the width of a near-field region generated by the metal structures to be covered by the dielectric layer, it is also suitable that the thickness is about 100 nm or more.

Example 3

In Example 3, a method of manufacturing a laminated filter and the optical characteristics thereof are described.

Figure 12A:
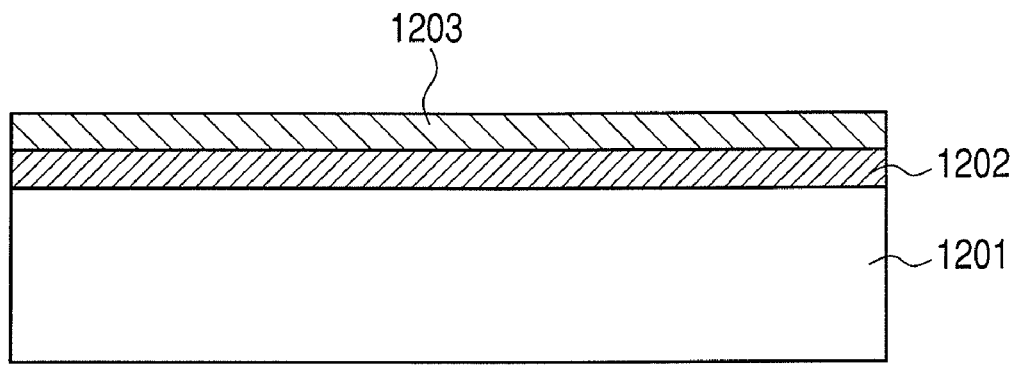
FIGS. 12A, 12B and 12C are schematic diagrams of an optical filter according to Example 3.

FIG. 12A is a view that illustrates a structure formed by depositing aluminium of a thickness of 30 nm as a first metallic thin film layer 1202 on the surface of a dielectric substrate 1201 comprising a quartz substrate with a thickness of 1 mm, and then coating a resist for electron beam (EB) lithography 1203 thereon.

Next, the resist 1203 is subjected to patterning using an EB lithography apparatus. The resist pattern is formed in a shape in which squares with sides of approximately 120 nm are arranged in a tetragonal lattice shape at a period of approximately 400 nm. By performing dry etching with plasma comprising a gaseous mixture of chlorine and oxygen using this resist pattern as an etching mask, first metallic thin film structures 1204 are produced.

Next, a quartz thin film with a thickness of 300 nm is formed as a first dielectric layer 1205 on the first metallic thin film structures 1204 by sputtering. Although the thickness of the first dielectric layer 1205 is not limited to 300 nm, an inter-layer distance can be secured that does not produce a near-field interaction with a second metallic thin film structure layer that is manufactured in the next process.

Figure 12B:
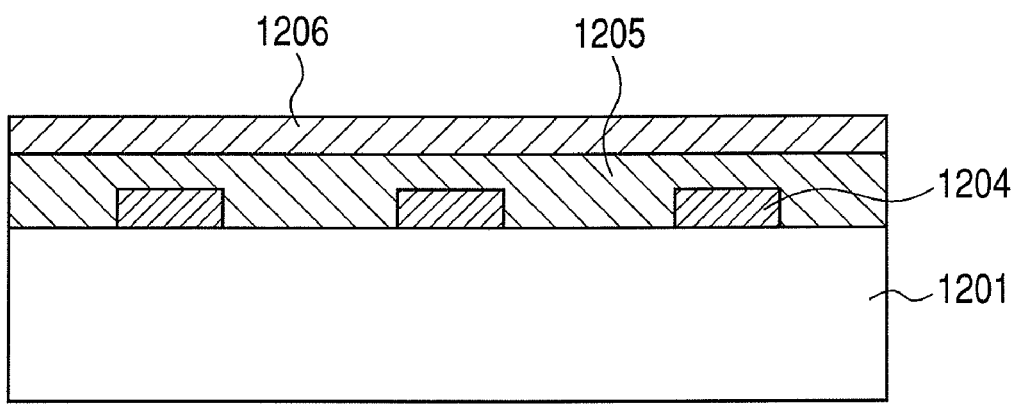

Next, as shown in FIG. 12B, aluminium of a thickness of 30 nm is deposited as a second metallic thin film layer 1206 on the surface of the first dielectric layer 1205. A resist for electron beam (EB) lithography is coated as a resist layer on the second metallic thin film layer 1206. Subsequently, patterning of the resist layer is performed with an EB lithography apparatus. The resist pattern is formed in a shape in which squares with sides of approximately 70 nm are arranged in a tetragonal lattice shape at a period of approximately 250 nm. By performing dry etching with plasma comprising a gaseous mixture of chlorine and oxygen using this resist pattern as an etching mask, second metallic thin film structures 1207 are produced.

Figure 12C:
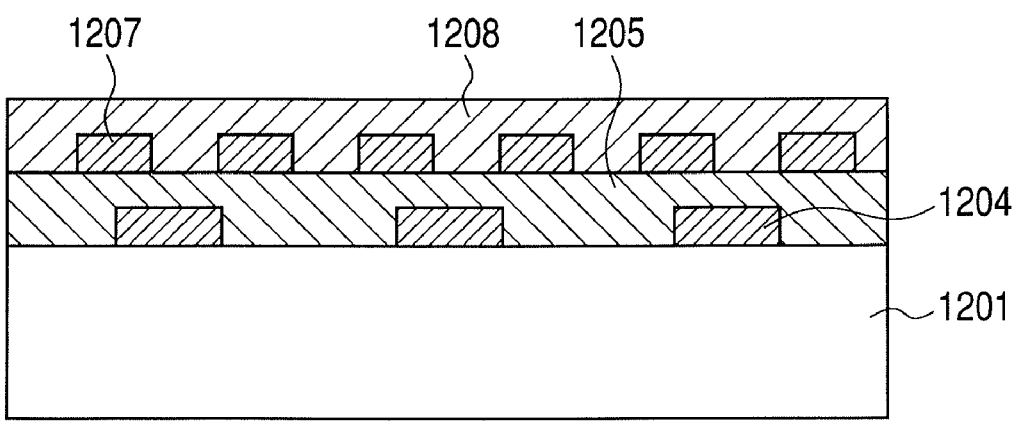

Next, as shown in FIG. 12C, a quartz thin film with a thickness of 400 nm is formed as a second dielectric layer 1208 on the second metal structures 1207 by sputtering.

Figure 13:
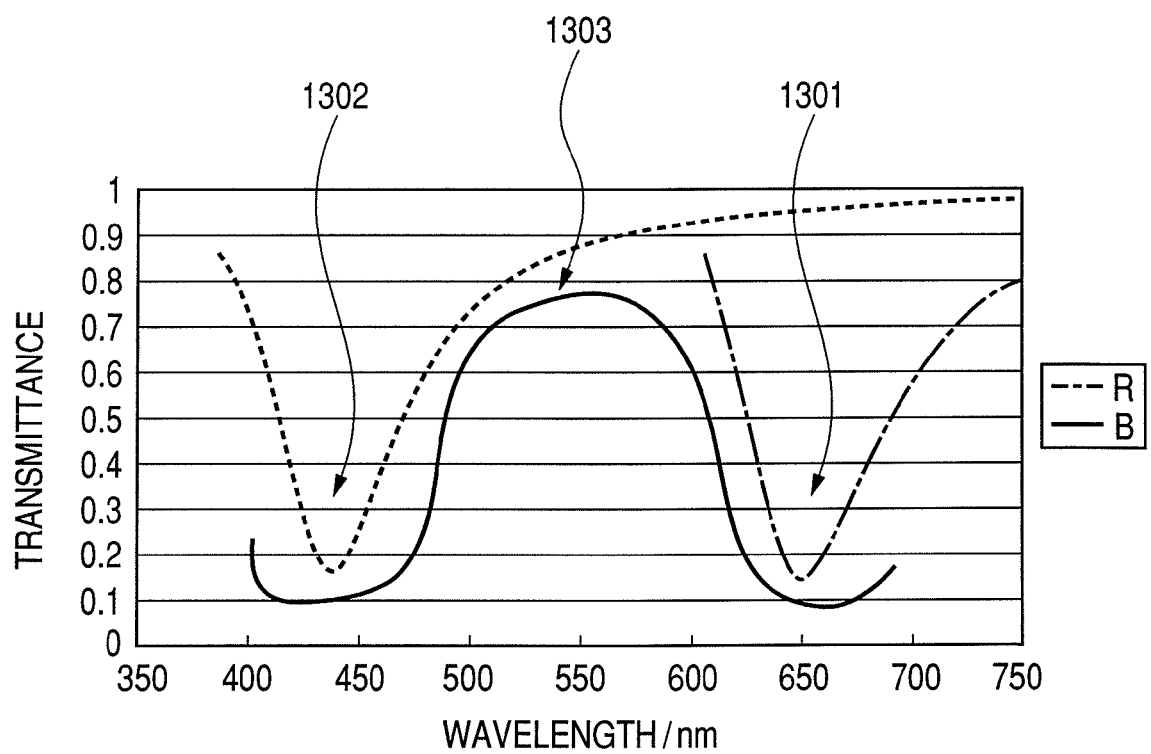
FIG. 13 is a diagram that illustrates transmission spectra obtained by the optical filter according to Example 3.

FIG. 13 illustrates transmission spectra of the laminated optical filter produced in this manner. A transmission spectrum 1301 of the first metallic thin film structures of this filter has an absorption peak in the vicinity of a wavelength of approximately 650 nm, and a transmission spectrum 1302 of the second metallic thin film structures has an absorption peak in the vicinity of a wavelength of approximately 450 nm. Thus, a laminated filter transmission spectrum 1303 of the filter according to the present example has a shape that is the product of the transmission spectrum 1301 and transmission spectrum 1302. Accordingly, it is found that the laminated filter according to the present example functions as an optical filter that allows green to pass through. That is, by forming a structure in which filters that function as complementary color filters as single layers are laminated, the filters can be made to function as primary colors filters.

Example 4

In Example 4, an example is described in which, by alternately arranging metal structures of differing sizes, that is, by overlappingly arranging two metal structure groups, a filter having a transmission spectrum in which a plurality of transmission spectra are combined can be realized with a single layer.

Figure 15A:
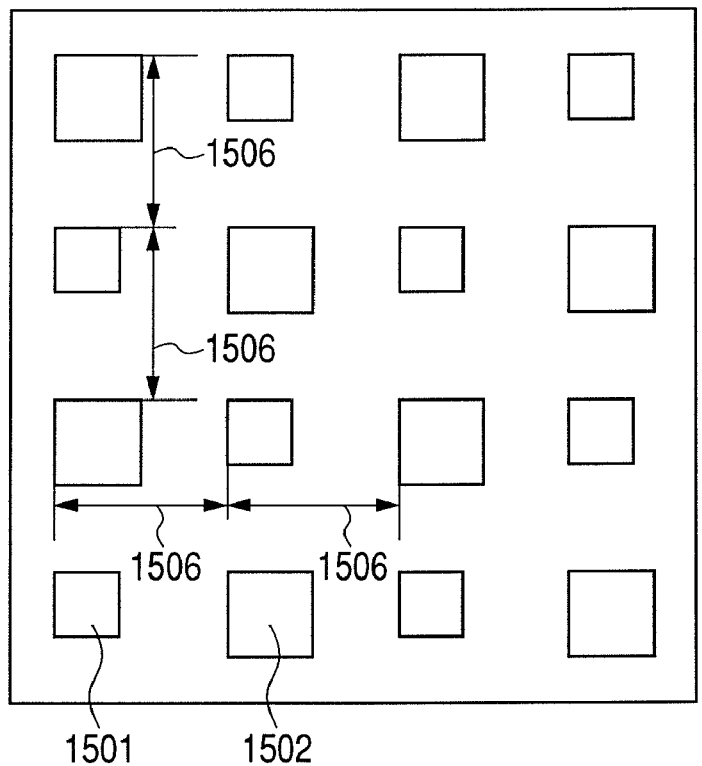
FIGS. 15A and 15B are schematic diagrams that illustrate an optical filter according to Example 4 and transmission spectra.

FIG. 15A is a view that illustrates an example in which metal structures 1501 comprising aluminium formed in squares with sides of 90 nm and metal structures 1502 comprising aluminium formed in squares with sides of 150 nm are arranged. The thickness of these metal structures is 60 nm. The metal structures 1501 and 1502 are arranged in mutually different tetragonal lattice shapes at a period 1506. In this case, the period 1506 is 250 nm.

Figure 15B:
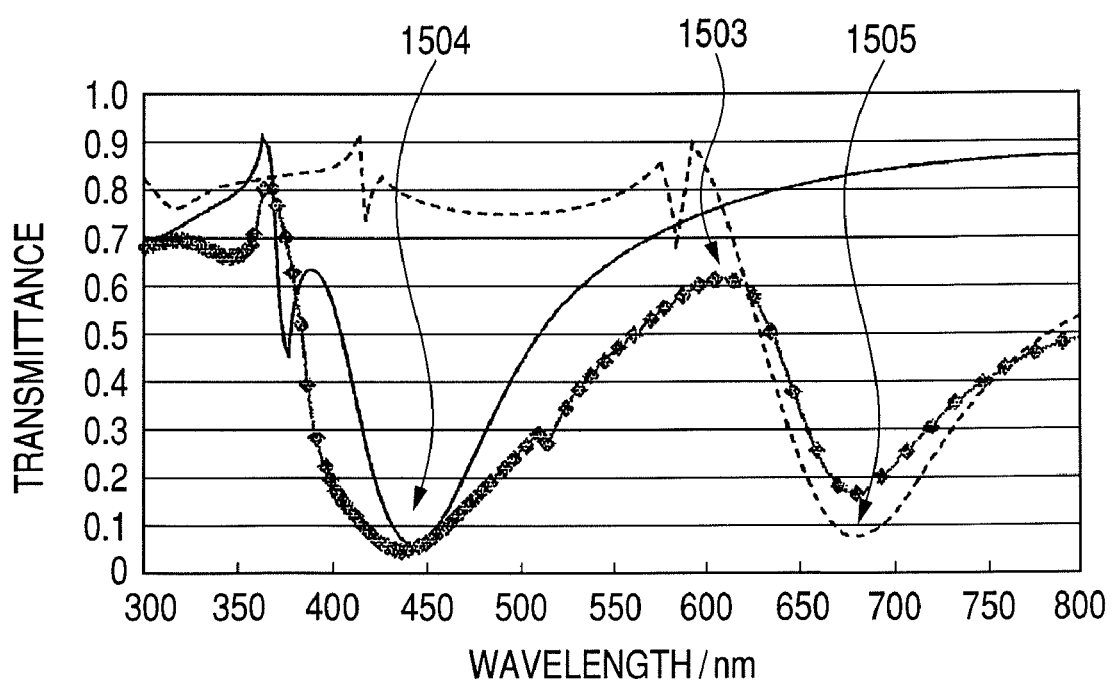

FIG. 15B is a view that illustrates a transmission spectrum 1503 of the optical filter produced in this manner. Meanwhile, as a reference, a transmission spectrum 1504 of an optical filter in which aluminium squares with sides of 90 nm and a thickness of 60 nm are arranged in a tetragonal lattice shape at a period of 250 nm is also shown. Further, a transmission spectrum 1505 of an optical filter in which aluminium squares with sides of 150 nm and a thickness of 60 nm are arranged in a tetragonal lattice shape at a period of 400 nm is shown.

Thus, since the optical filter according to the present example has the transmission spectrum 1503, it is possible to obtain a spectrum that manifests both the characteristics of a two-layer filter while keeping a single-layer structure.

Further, it can be considered that the transmission spectrum 1503 has the characteristic of a filter having a maximum transmittance value in the vicinity of a 600-nm wavelength. Thus, it is possible to manifest the functions of two layers of a complementary color filter with a single layer. In this connection, it is possible to produce the optical filter according to the present example more easily in comparison to a case of laminating filters with a single layer of metal structures.

Although a case has been described according to the present example in which shapes of two kinds of metal structures are mixed in the same plane, the shapes of metal particles that exist in the same plane may be of three kinds or more. Further, a configuration may be designed so as to obtain desired optical characteristics by arranging structure groups at periods that are modulated.

Example 5

The present example is directed to a light-detecting device using the optical filters explained in Examples 1 through 4, and, an image pickup device comprised of an array of the optical detecting devices, which pickup device is incorporated into a camera.

Figure 23:
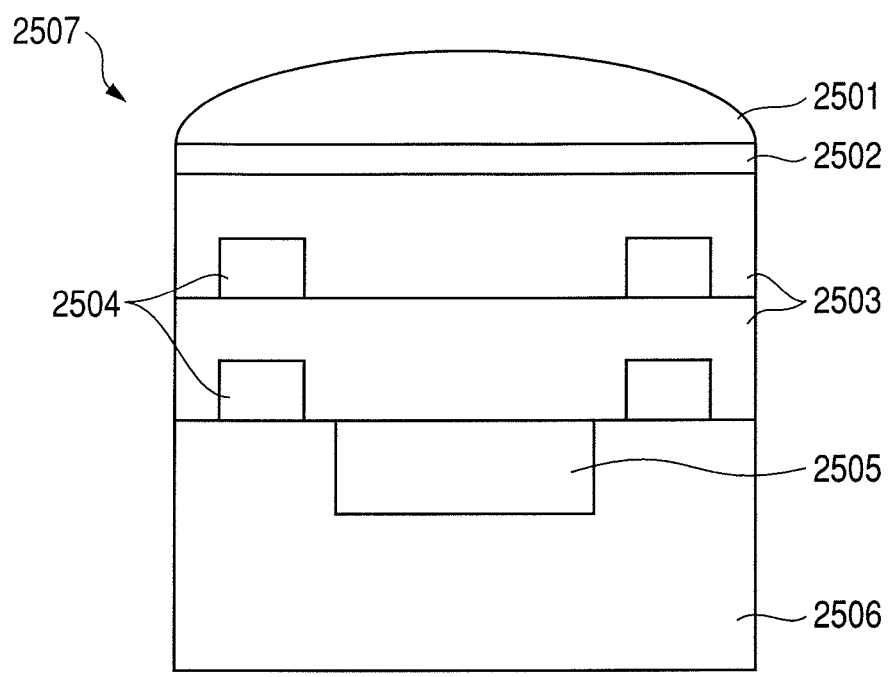
FIG. 23 is a schematic view of the light-detecting device of the present invention.

FIG. 23 is a schematic view of the light-detecting device using the optical filter of the present invention. A light-detecting device 2507 introduces a light incident from the outside through a microlens 2501 into a photoelectric converting portion 2505. The photoelectric converting portion generates a charge according to the incident light. The light-detecting device includes an optical filter 2502 disclosed in the present application, a dielectric layer 2503, electron circuits 2504 and a semiconductor substrate 2506, besides the photoelectric converting portion. The optical filter 2502 includes such a structure capable of inducing a plasmon resonance to the light as the metal structure 120 in FIGS. 1A and 1B.

Figure 24:
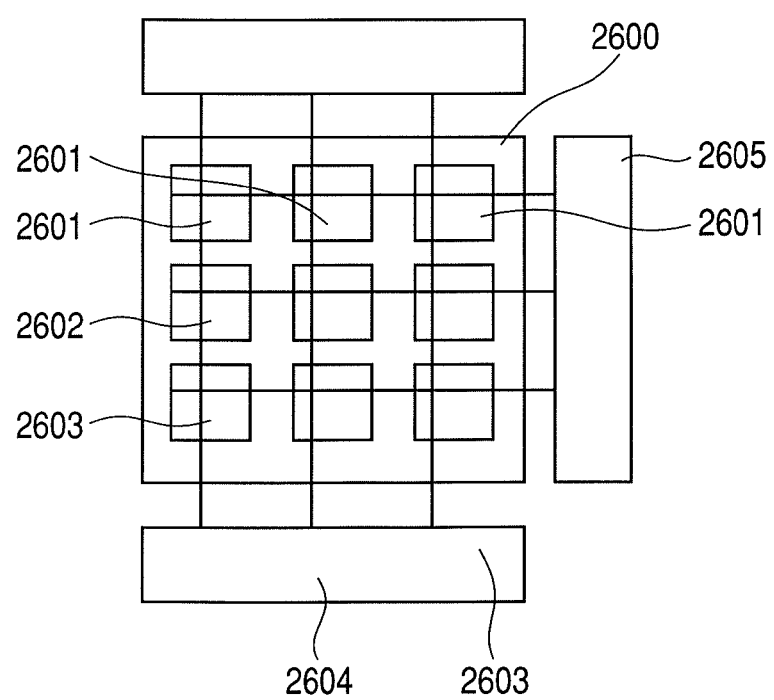
FIG. 24 is a schematic view of the image pickup device of the present invention.

FIG. 24 is a schematic view of the image pickup device using the optical filter of the present invention. A pixel area 2600 has a 3×3 two-dimensional matrix of the aforementioned light-detecting device (; pixels) 2601a through 2603c. Alternatively, e.g. 7680×4320 matrix can be also used as the matrix of the image area 2600 in FIG. 24.

The vertical scanning circuit 2605 and the horizontal scanning circuit 2604 in FIG. 24 are circuits for selecting light-detecting device (; pixel) to be read out among the whole light-detecting devices located in the pixel area 2600.

Figure 25:
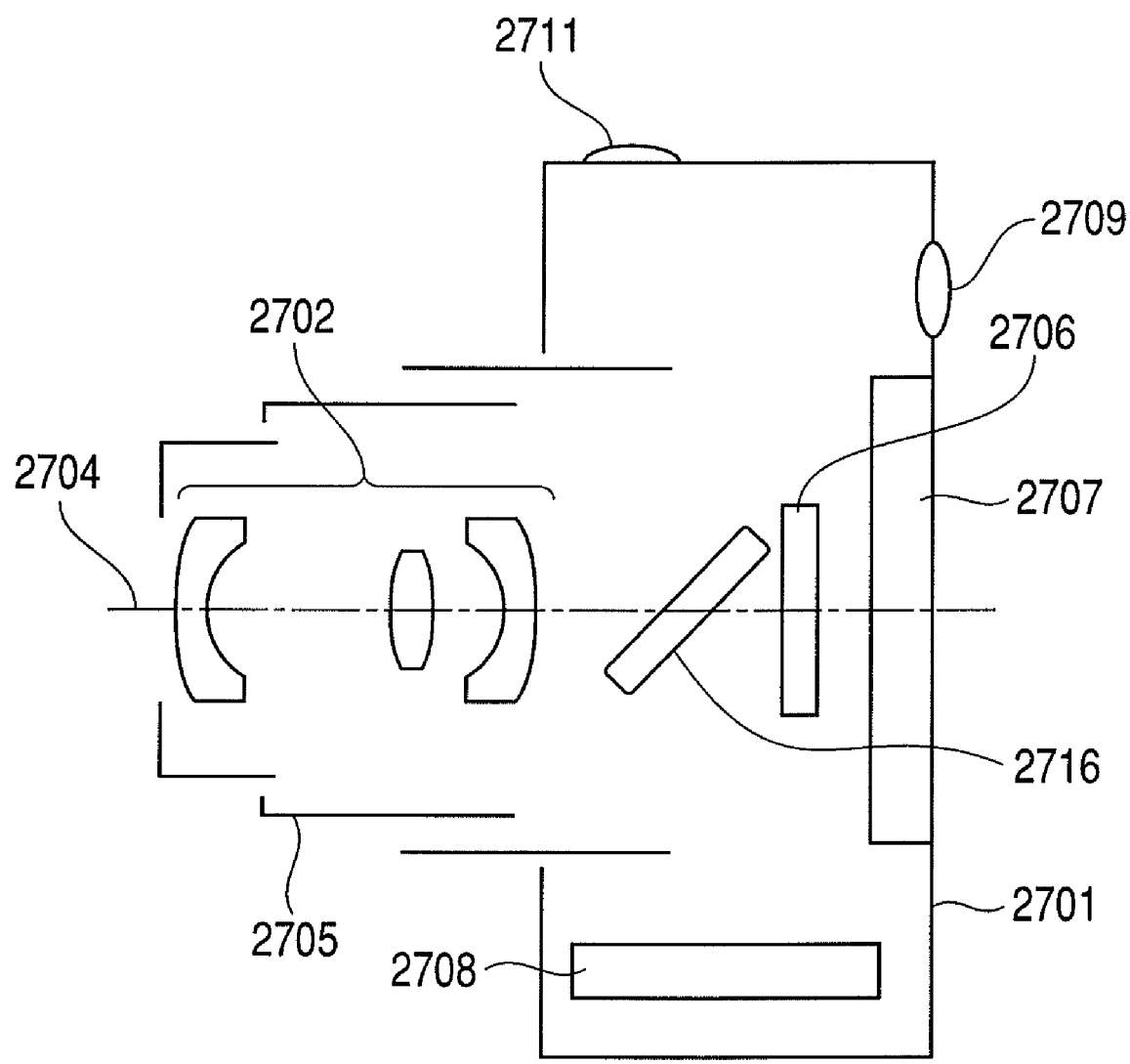
FIG. 25 is a schematic view of the digital camera of the present invention.

FIG. 25 illustrates a schematic view of a digital camera into which the image pickup device having such a constitution as in FIG. 24 is incorporated. In FIG. 25, numeral 2701 denotes a body of camera; 2709, an eyepiece; 2711, a shatter; and 2706, a mirror.

The image pickup device of the present invention is represented by numeral 2706, to which a light is incident through a photographic optical system (lens) 2702 located in a lens barrel 2705. The device generates a charge in each of the image pickup devices 2706 according to an subject to realize the reproducing of the subject according to the generated charge. The image of the subject can be reproduced on a monitoring display 2707 and memorized in a recording medium 2708 as a memory card.

The optical filter of the present invention is thinner than color filters comprised of general colorants so that the image pickup device of the present invention as disclosed here can be made with a thin thickness. As a result, the distance from the surface of the image pickup device to the photoelectric converting portion of the image pickup device is shortened so that the use efficiency of the light is improved, and the sensitivity can be, therefore, improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-184599, filed Jul. 13, 2007 and 2008-136686, filed May 26, 2008, which are hereby incorporated by reference in their entirety.

The invention claimed is:

1. An optical filter that transmits or reflects light of a first wavelength, the optical filter including:
   a dielectric substrate;
   a first metal structure group in which a plurality of first metal structures are arranged two-dimensionally in an isolated state in the in-plane direction of the dielectric substrate, that is provided on a surface of the dielectric substrate; and
   a dielectric layer with which the first metal structure group is covered,
   wherein the first metal structures have a first length in a first direction and a second length in a second direction orthogonal to the first direction, the first length and the second length being less than or equal to the first wavelength,
   wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, and
   wherein the first length and the second length are within a range of 110 nm or more and 160 nm or less, a thickness of the first metal structures is within a range of 10 nm or more and 100 nm or less, a period at which the first metal structures are arranged is within a range of 340 nm or more and 450 nm or less, and the first wavelength is within a range of 550 nm or more and less than 650 nm.

2. The optical filter according to claim 1, wherein the first length and the second length are the same.

3. The optical filter according to claim 2, wherein the first metal structures are in a square shape.

4. The optical filter according to claim 1, wherein the first metal structures consist of aluminum, or an alloy or a mixture including aluminum.

5. The optical filter according to claim 1, wherein a dielectric constant of the dielectric substrate and a dielectric constant of the dielectric layer are the same.

6. The optical filter according to claim 1, wherein the dielectric substrate and the dielectric layer are comprised of any one selected from the group consisting of silicon dioxide, titanium dioxide, and silicon nitride.

7. An optical filter that transmits or reflects light of a first wavelength, the optical filter including:
   a dielectric substrate;
   a first metal structure group in which a plurality of first metal structures are arranged two-dimensionally in an isolated state in the in-plane direction of the dielectric substrate, that is provided on a surface of the dielectric substrate; and
   a dielectric layer with which the first metal structure group is covered,
   wherein the first metal structures have a first length in a first direction and a second length in a second direction orthogonal to the first direction, the first length and the second length being less than or equal to the first wavelength,
   wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, and
   wherein the first length and the second length are within a range of 90 nm or more and less than 130 nm, a thickness of the first metal structures is within a range of 10 nm or more and 100 nm or less, a period at which the first metal structures are arranged is within a range of 260 nm or more and 340 nm or less, and the first wavelength is within a range of 450 nm or more and less than 550 nm.

8. An optical filter that transmits or reflects light of a first wavelength, the optical filter including:
   a dielectric substrate;
   a first metal structure group in which a plurality of first metal structures are arranged two-dimensionally in an isolated state in the in-plane direction of the dielectric substrate, that is provided on a surface of the dielectric substrate; and
   a dielectric layer with which the first metal structure group is covered,
   wherein the first metal structures have a first length in a first direction and a second length in a second direction orthogonal to the first direction, the first length and the second length being less than or equal to the first wavelength,
   wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, and
   wherein the first length and the second length are within a range of 60 nm or more and less than 100 nm, a thickness of the first metal structures is within a range of 10 nm or more and 100 nm or less, a period at which the first metal structures are arranged is within a range of 180 nm or more and 280 nm or less, and the first wavelength is within a range of 350 nm or more and less than 450 nm.

9. An optical filter that transmits or reflects light of a first wavelength, the optical filter including:
   a dielectric substrate;
   a first metal structure group in which a plurality of first metal structures are arranged two-dimensionally in an isolated state in the in-plane direction of the dielectric substrate, that is provided on a surface of the dielectric substrate; and a dielectric layer with which the first metal structure group is covered, wherein the first metal structures have a first length in a first direction and a second length in a second direction orthogonal to the first direction, the first length and the second length being less than or equal to the first wavelength, wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, wherein in addition to the first metal structure group, there is a second metal structure group in which a plurality of second metal structures are arranged two-dimensionally in an isolated state in an in-plane direction of the dielectric substrate, wherein the second metal structures have a third length in the first direction and a fourth length in the second direction, the third length and the fourth length being less than or equal to a second wavelength different from the first wavelength, wherein the third length is different from the first length or the fourth length is different from the second length, wherein the first metal structure group and the second metal structure group are arranged in different regions of the dielectric substrate surface, and wherein a transmittance of the second wavelength is made minimal or a reflectance of the second wavelength is made maximal by localized surface plasmons induced on a surface of the second metal structures by resonance between light incident on the dielectric substrate or the dielectric layer and the second metal structures.

10. An optical filter that transmits or reflects light of a first wavelength, the optical filter including:

a dielectric substrate;

a first metal structure group in which a plurality of first metal structures are arranged two-dimensionally in an isolated state in the in-plane direction of the dielectric substrate, that is provided on a surface of the dielectric substrate; and a dielectric layer with which the first metal structure group is covered, wherein the first metal structures have a first length in a first direction and a second length in a second direction orthogonal to the first direction, the first length and the second length being less than or equal to the first wavelength, wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, wherein two or more of the first metal structure groups are positioned in an in-plane direction of the dielectric substrate, and wherein the two or more first metal structure groups are arranged in overlapping regions.

11. An optical filter that transmits or reflects light of a first wavelength, the optical filter including:

a dielectric substrate;

a first metal structure group in which a plurality of first metal structures are arranged two-dimensionally in an isolated state in the in-plane direction of the dielectric substrate, that is provided on a surface of the dielectric substrate; and a dielectric layer with which the first metal structure group is covered, wherein the first metal structures have a first length in a first direction and a second length in a second direction orthogonal to the first direction, the first length and the second length being less than or equal to the first wavelength, wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, wherein two or more of the first metal structure groups are positioned in an in-plane direction of the dielectric substrate, wherein periods at which the first metal structures comprising the two or more first metal structure groups are arranged are different from each other, and wherein the two or more first metal structure groups are arranged in overlapping regions.

12. An optical filter that transmits or reflects light of a first wavelength, the optical filter including:

a dielectric substrate;

a first metal structure group in which a plurality of first metal structures are arranged two-dimensionally in an isolated state in the in-plane direction of the dielectric substrate, that is provided on a surface of the dielectric substrate; and a dielectric layer with which the first metal structure group is covered, wherein the first metal structures have a first length in a first direction and a second length in a second direction orthogonal to the first direction, the first length and the second length being less than or equal to the first wavelength, wherein a transmittance of the first wavelength is made minimal or a reflectance of the first wavelength is made maximal by localized surface plasmons induced on a surface of the first metal structures by resonance between light incident on the dielectric substrate or the dielectric layer and the first metal structures, wherein in addition to the first metal structure group, there is a second metal structure group in which a plurality of second metal structures are arranged two-dimensionally in an isolated state in an in-plane direction of the dielectric substrate, wherein the second metal structures have a third length in the first direction and a fourth length in the second direction, the third length and the fourth length being less than or equal to a second wavelength different from the first wavelength, wherein the third length is different from the first length or the fourth length is different from the second length, wherein the first metal structure group and the second metal structure group are arranged in overlapping regions, and wherein a transmittance of the second wavelength is made minimal or a reflectance of the second wavelength is made maximal by localized surface plasmons induced on a surface of the second metal structures by resonance between light incident on the dielectric substrate or the dielectric layer and the second metal structures.

13. A laminated optical filter in which an optical filter that transmits or reflects light of a first wavelength and an optical filter that transmits or reflects light of a second wavelength are laminated, including:
- a dielectric substrate;
- a first metal structure group in which a plurality of first metal structures are arranged two-dimensionally in an isolated state in the in-plane direction of the dielectric substrate, that is provided on a surface of the dielectric substrate; and
- a dielectric layer with which the first metal structure group is covered,
- wherein the first metal structures have a first length in a first direction and a second length in a second direction orthogonal to the first direction, the first length and the second length being less than or equal to the first wavelength,
- wherein another dielectric layer is formed on a surface of the dielectric layer,
- wherein a second metal structure group in which a plurality of second metal structures are arranged two-dimensionally in an isolated state in an in-plane direction of the dielectric substrate is provided between the surface of the dielectric layer and the another dielectric layer,
- wherein the second metal structures constituting the second metal structure group have a third length in the first direction and a fourth length in the second direction, the third length and the fourth length being less than or equal to a second wavelength different from the first wavelength,
- wherein the third length is different from the first length or the fourth length is different from the second length, or periods at which the second metal structures are arranged are different from periods at which the first metal structures are arranged,
- wherein a transmittance of the first wavelength is made minimal or a reflectance of the first wavelength is made maximal by localized surface plasmons induced on a surface of the first metal structures, and
- wherein a transmittance of the second wavelength is made minimal or a reflectance of the second wavelength is made maximal by localized surface plasmons induced on a surface of the second metal structures.

14. A light receiving element comprising the optical filter according to any one of claims 1 to 13.

15. A light receiving element according to claim 14, comprising a CCD sensor.

16. A light receiving element according to claim 14, comprising a CMOS sensor.

* * * * *